United States Patent
Xiong et al.

(10) Patent No.: US 10,585,642 B2
(45) Date of Patent: *Mar. 10, 2020

(54) SYSTEM AND METHOD FOR MANAGING DATA IN A RING BUFFER

(71) Applicant: Advanced Micro Devices, Inc., Santa Clara, CA (US)

(72) Inventors: XuHong Xiong, Shanghai (CN); Pingping Shao, Cupertino, CA (US); ZhongXiang Luo, Shanghai (CN); ChenBin Wang, Shanghai (CN)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/160,924

(22) Filed: Oct. 15, 2018

(65) Prior Publication Data

US 2019/0050198 A1    Feb. 14, 2019

Related U.S. Application Data

(63) Continuation of application No. 15/271,077, filed on Sep. 20, 2016, now Pat. No. 10,101,964.

(51) Int. Cl.
| | |
|---|---|
| *G06F 5/14* | (2006.01) |
| *G11C 21/00* | (2006.01) |
| *G06F 12/0811* | (2016.01) |
| *G06F 13/16* | (2006.01) |
| *G06F 5/06* | (2006.01) |

(52) U.S. Cl.
CPC ............. *G06F 5/14* (2013.01); *G06F 5/065* (2013.01); *G06F 12/0811* (2013.01); *G06F 13/1673* (2013.01); *G11C 21/00* (2013.01); *G06F 2205/067* (2013.01); *G06F 2205/126* (2013.01); *G06F 2212/283* (2013.01)

(58) Field of Classification Search
CPC .... G06F 5/14; G06F 13/1673; G06F 12/0811; G06F 5/065; G06F 2205/067; G06F 2205/126; G06F 2212/283; G11C 21/00
See application file for complete search history.

(56) References Cited

U.S. PATENT DOCUMENTS

| | | | |
|---|---|---|---|
| 5,708,849 A | 1/1998 | Coke et al. | |
| 5,948,082 A * | 9/1999 | Ichikawa | G06F 3/061 710/52 |
| 6,112,267 A * | 8/2000 | McCormack | G06F 12/08 710/52 |
| 7,133,975 B1 * | 11/2006 | Isaac | G06F 12/0811 711/141 |
| 2005/0144390 A1 * | 6/2005 | Mattina | G06F 12/0813 711/130 |

(Continued)

*Primary Examiner* — Tasnima Matin
(74) *Attorney, Agent, or Firm* — Volpe and Koenig, P.C.

(57) ABSTRACT

A system and method for managing data in a ring buffer is disclosed. The system includes a legacy ring buffer functioning as an on-chip ring buffer, a supplemental buffer for storing data in the ring buffer, a preload ring buffer that is on-chip and capable of receiving preload data from the supplemental buffer, a write controller that determines where to write data that is write requested by a write client of the ring buffer, and a read controller that controls a return of data to a read client pursuant to a read request to the ring buffer.

20 Claims, 27 Drawing Sheets

(56) References Cited

U.S. PATENT DOCUMENTS

| | | | |
|---|---|---|---|
| 2007/0245074 A1* | 10/2007 | Rosenbluth | G06F 5/10 |
| | | | 711/110 |
| 2008/0228991 A1 | 9/2008 | Ferroussat et al. | |
| 2010/0153650 A1* | 6/2010 | Guthrie | G06F 12/0817 |
| | | | 711/133 |
| 2011/0010522 A1 | 1/2011 | Abts et al. | |
| 2012/0072702 A1* | 3/2012 | Pierson | G06F 12/0862 |
| | | | 712/207 |
| 2014/0237160 A1 | 8/2014 | Dong | |
| 2015/0199275 A1* | 7/2015 | Radhakrishnan | G06F 12/0862 |
| | | | 711/137 |
| 2015/0356015 A1* | 12/2015 | Sathish | G06F 12/0862 |
| | | | 711/119 |
| 2016/0070535 A1 | 3/2016 | Karr | |

* cited by examiner

SYSTEM AND METHOD FOR MANAGING DATA IN A RING BUFFER

CROSS REFERENCE TO RELATED APPLICATION

This application is a continuation of U.S. patent application Ser. No. 15/271,077, filed Sep. 20, 2016 which is incorporated by reference as if fully set forth.

BACKGROUND

A ring buffer, also known as a circular buffer, circular queue, or cyclic buffer, is a data structure that uses a single, fixed-size buffer as if it were connected end-to-end. The ring buffer structure improves the buffering of data streams. Generally, a ring buffer does not need to have its elements shuffled around when one is consumed. A ring buffer is well-suited as a first-in first-out (FIFO) buffer.

Ring buffers may be designed to be on-chip or off-chip. On-chip ring buffers exhibit fast write/read times but have limited size (e.g., once the size is consumed, on-chip ring buffers stall with no free space). Off-chip ring buffers have larger sizes but exhibit slower access speed due to the use of a Layer 2 (L2) cache or off-chip memory to store data.

In operation, a ring buffer has a write and read pointer. A consequence of the circular buffer is that when it is full and a subsequent write is performed, then it starts overwriting the oldest data. A circular buffer can be implemented using pointers or indices for the buffer start in memory, buffer end in memory, or buffer capacity, start of valid data, and end of valid data, or amount of data currently in the buffer.

When an element is written, the start pointer is incremented to the next element. In the pointer-based implementation strategy, the buffer's full or empty state can be resolved from the start and end indexes. When the start and end indexes are equal, the buffer is empty. When the start index is one greater than the end index, the buffer is full. Alternatively, if the buffer is designed to track the number of inserted elements n, checking for emptiness means checking n=0 and checking for fullness means checking whether n equals the capacity.

Ring buffers are broadly used in ASIC design. Size and access performance are two major concerns to ring buffer design and use. Larger sizes can decouple the data producer and the consumer, but at the cost of access (read/write) speed and integrated circuit area. Therefore, a need exists for an improved ring buffer design.

BRIEF DESCRIPTION OF THE DRAWINGS

A more detailed understanding may be had from the following description, given by way of example in conjunction with the accompanying drawings wherein.

DETAILED DESCRIPTION

Figure 1:
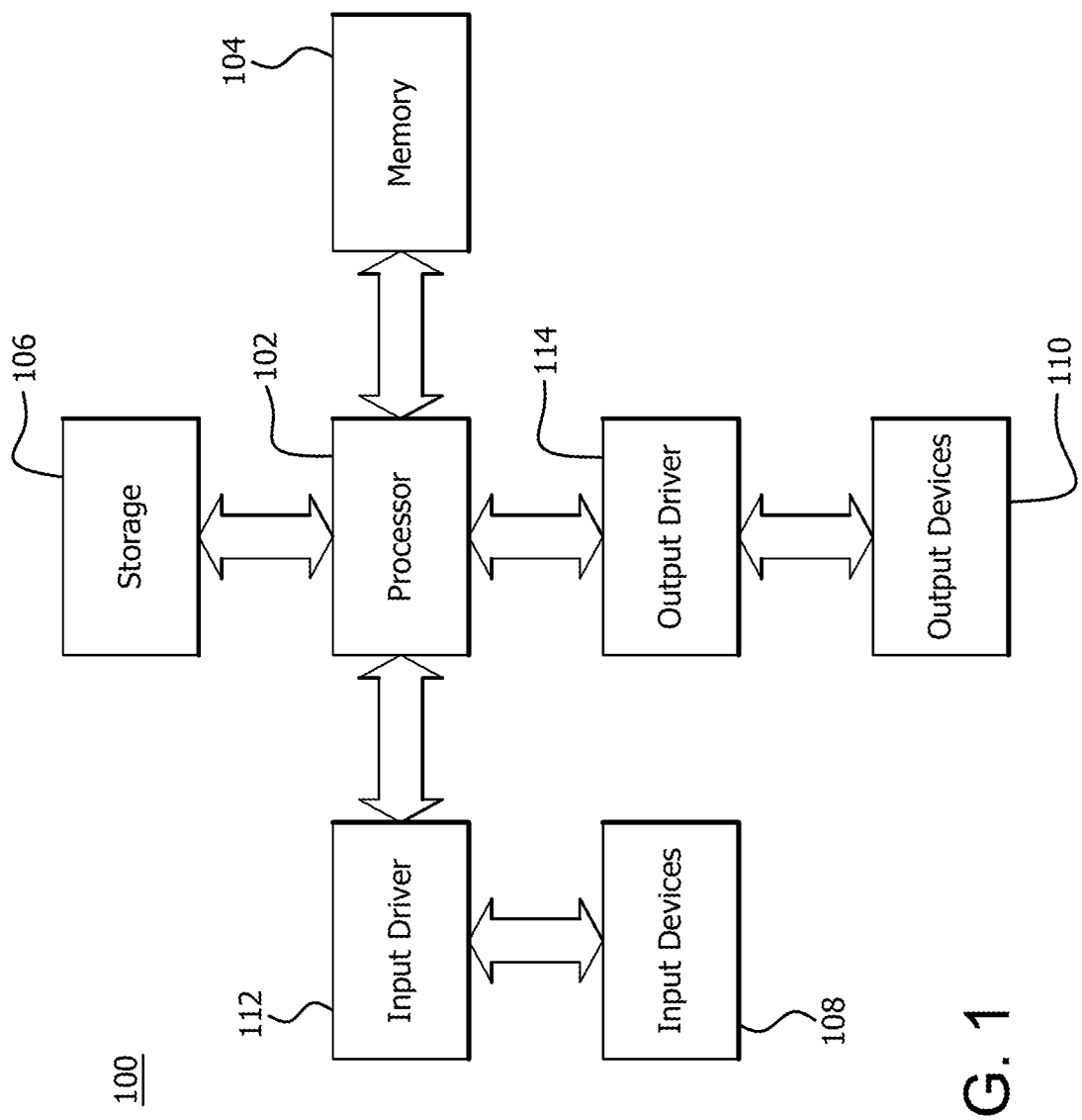
FIG. 1 is a block diagram of an example device in which one or more disclosed invention may be implemented.

The present disclosure is directed to an improved ring buffer design that combines an on-chip ring buffer and a supplemental buffer that can be a large sized buffer and can include off-chip storage. Hereinafter, the on-chip ring buffer is referred to as a "legacy ring buffer". Examples of the off-chip storage include a main memory (e.g., DRAM, hereinafter referred to as "DDR") or a L2 cache (hereinafter referred to as "L2 cache" or "L2 buffer") for ring buffer data. This design provides the advantages of on-chip ring buffer access times and the increased size of off-chip ring buffers.

As will be described in more detail below, a write controller is utilized to control data writes to the ring buffer, and a read controller is utilized to control data reads from the ring buffer. From data write/read client viewpoint, the on-chip ring buffer and L2 cache are combined as a flat ring buffer.

The present invention includes a hierarchical ring buffer structure and an efficient, low complexity de-allocate/allocate method for associated buffer management that improves ring buffer read/write rate performance while removing or reducing the size limitations. The present invention may be applied to a parameter cache, position buffer, local data share (LDS), or other device, within a graphics processing unit (GPU) chip, for example, and used as ring buffer.

According to an implementation, a system and method for managing data in a ring buffer is disclosed. The system includes a legacy ring buffer functioning as an on-chip ring buffer, a supplemental buffer for storing data in the ring buffer, a preload ring buffer that is on-chip and capable of receiving preload data from the supplemental buffer, a write controller that determines where to write data that is write requested by a write client of the ring buffer, and a read controller that controls a return of data to a read client pursuant to a read request to the ring buffer.

The ring buffer operates such that if the legacy ring buffer is not full and the supplemental buffer is empty, the write controller writes to the legacy ring buffer on a write request. If the legacy ring buffer is full and the supplemental buffer is not full, the write controller stores data to the supplemental buffer on a write request. If the legacy ring buffer is full and there is no data in the supplemental buffer, the write controller writes data to preload ring buffer on a write request.

The ring buffer operates such that upon receipt of the read request, the read controller examines the legacy ring buffer and preload ring buffer to satisfy the read request. If the legacy ring buffer contains the data to be read in the read request, the data is supplied from the legacy ring buffer to satisfy the read request. If the preload ring buffer contains the data to be read in the read request, the data is supplied from the preload ring buffer to satisfy the read request. If the legacy ring buffer and preload ring buffer do not contain the data to be read in the read request, the data read request is sent to the supplemental buffer to fetch the data. The system then returns the read data to the read client from the supplemental buffer.

FIG. 1 is a block diagram of an example device 100 in which one or more disclosed embodiments may be implemented. The device 100 includes, for example, a computer, a gaming device, a handheld device, a set-top box, a television, a mobile phone, or a tablet computer. The device 100 includes a processor 102, a memory 104, a storage 106, one or more input devices 108, and one or more output devices 110. The device 100 may also optionally include an input driver 112 and an output driver 114. It is understood that the device 100 may include additional components not shown in FIG. 1.

The processor 102 includes a central processing unit (CPU), a graphics processing unit (GPU), a CPU and GPU located on the same die, or one or more processor cores, wherein each processor core is a CPU or a GPU. The memory 104 is located on the same die as the processor 102, or is located separately from the processor 102. The memory 104 includes a volatile or non-volatile memory, for example, random access memory (RAM), dynamic RAM, or a cache.

The storage 106 includes a fixed or removable storage, for example, a hard disk drive, a solid state drive, an optical disk, or a flash drive. The input devices 108 may include a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 may include a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 operates in the same manner if the input driver 112 and the output driver 114 are not present.

Figure 2:
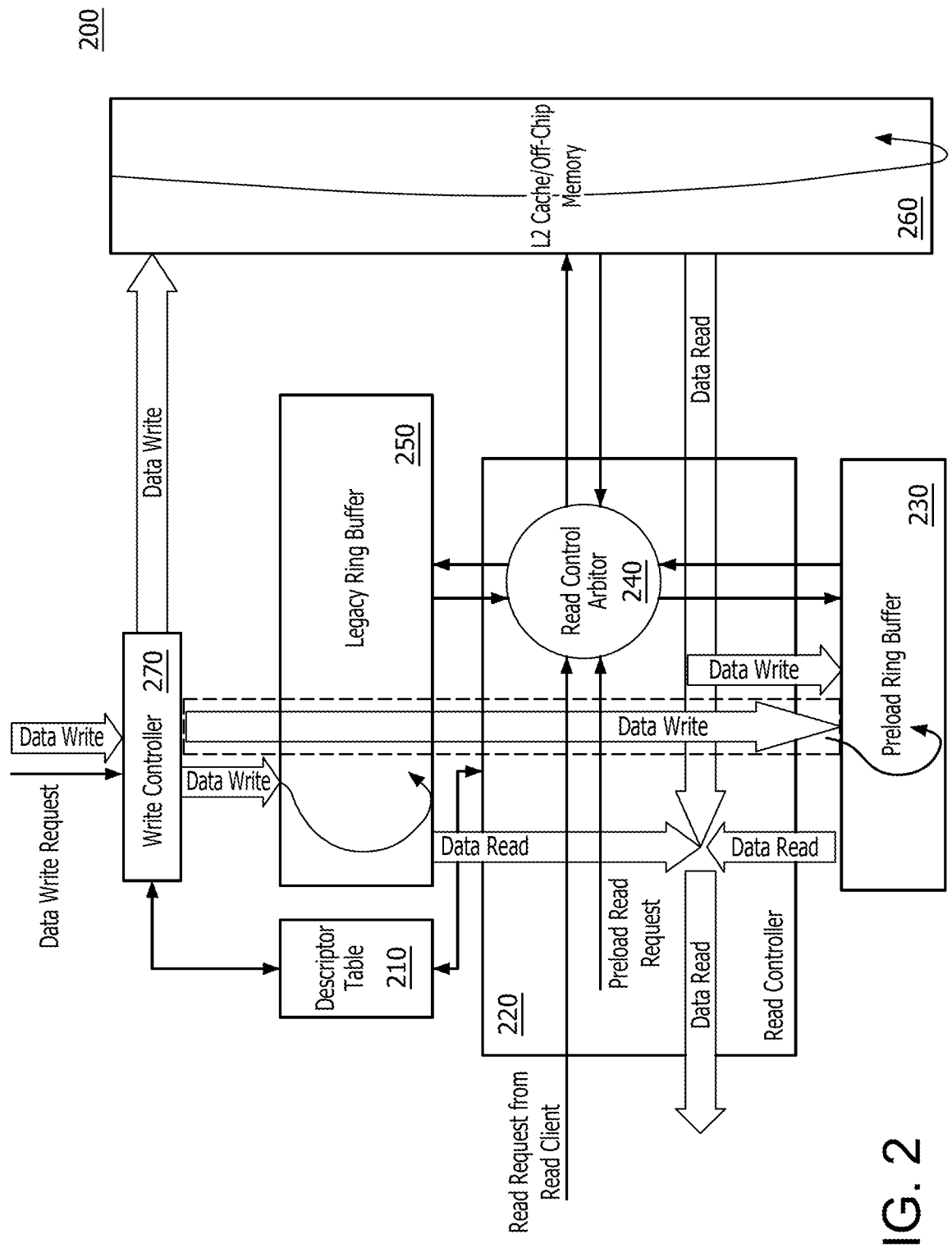
FIG. 2 is an illustration of the structure of a ring buffer.

FIG. 2 is an illustration of the structure of a ring buffer 200. Ring buffer 200 includes a descriptor table 210, a read controller 220, a preload ring buffer 230, a read control arbiter 240, a legacy ring buffer 250, a L2 cache 260 and a write controller 270.

Legacy ring buffer 250 is an on-chip ring buffer and L2 cache 260 is a large-size memory and may be off-chip memory. Preload ring buffer 230 is an on-chip ring buffer that preloads data from L2 cache 260. Write controller 270 controls data writes to ring buffer 200. Read controller 220 controls read data from ring buffer 200. From a data write/read perspective, the legacy ring buffer 250 and L2 cache 260 are combined to operate as if they are a flat ring buffer.

A data write request and data to be written are inputs to write controller 270. For example, the data write request may come from a GPU shader. As will be described in more detail below with respect to FIGS. 3 and 4, write controller 270 writes to legacy ring buffer 250, preload ring buffer 230, or L2 cache 260.

Read control arbiter 240 is a part of read controller 220. Alternatively, the read control arbiter 240 may be placed or reside in another part of ring buffer 200. Read control arbiter 240 functions according to the flows of FIGS. 8 and 9. Read control arbiter 240 is in bidirectional communication with legacy ring buffer 250, L2 cache 260, and preload ring buffer 230. Read control arbiter 240 receives read requests from a read client (not shown) and receives preload read request from read controller 220 via a decided preload condition.

Read controller 220 receives the data reads based on the control of read control arbiter 240 from legacy ring buffer 250, L2 cache 260, and preload ring buffer 230. The read controller 220 has a data read output.

Preload ring buffer 230 has as an input a data write from a data read of L2 cache 260.

Descriptor table 210 communicates with write controller 270 and with read controller 220. In an implementation, the communications with the write controller 270 and read controller 220 are unidirectional. In another implementation the communications are bidirectional.

Figure 3:
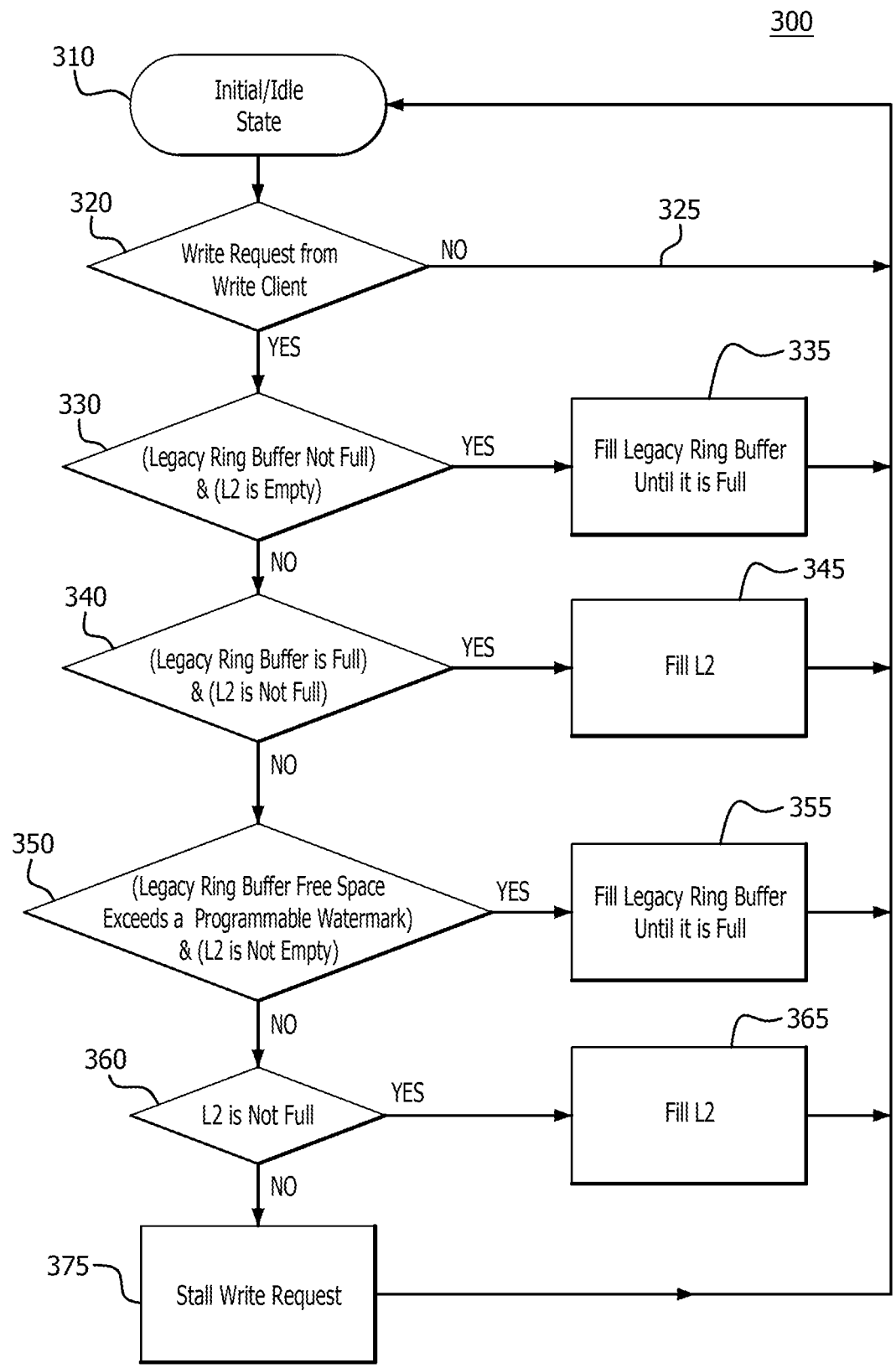
FIG. 3 illustrates the data write control flow of the ring buffer of FIG. 2.

FIG. 3 illustrates the data write control flow 300 of the ring buffer 200 of FIG. 2. Flow 300 controls the data write by deciding to write to legacy ring buffer 250 and/or L2 cache 260.

At step 310, flow 300 begins with an initial/idle state to wait for a write request. At step 320, a determination is made if the write request from the write client is a write request to be written. If this determination 320 is NO at block 325, flow 300 returns to step 310.

If the determination 320 is YES, then step 330 is performed to allow flow 300 to control when a write client stores data to ring buffer 200 by deciding if the legacy ring buffer 250 is not full (i.e., has available space for writing) and L2 cache 260 is empty. If decision 330 is YES, the data write is directed to the legacy ring buffer 250 until the legacy ring buffer 250 is full at step 335.

If decision 330 is NO, then a determination at step 340 is made to decide if the legacy ring buffer 250 is full, i.e., when one data block cannot be written, and L2 cache 260 is not full. If determination 340 is YES, the data write is directed to the L2 cache 260 at step 345.

If determination 340 is NO, a determination is made at step 350 to decide if the legacy ring buffer 250 free space exceeds a programmable watermark and L2 cache 260 is not empty. If determination 350 is YES, the data write is directed to the legacy ring buffer 250 until legacy ring buffer 250 is full at step 355.

If determination 350 is NO, a determination of whether L2 cache 260 is not full is performed at step 360. If determination 360 is YES, the data write is directed to L2 cache 260 at step 365. If determination 360 is NO the write request may be stalled at step 375.

Figure 4:
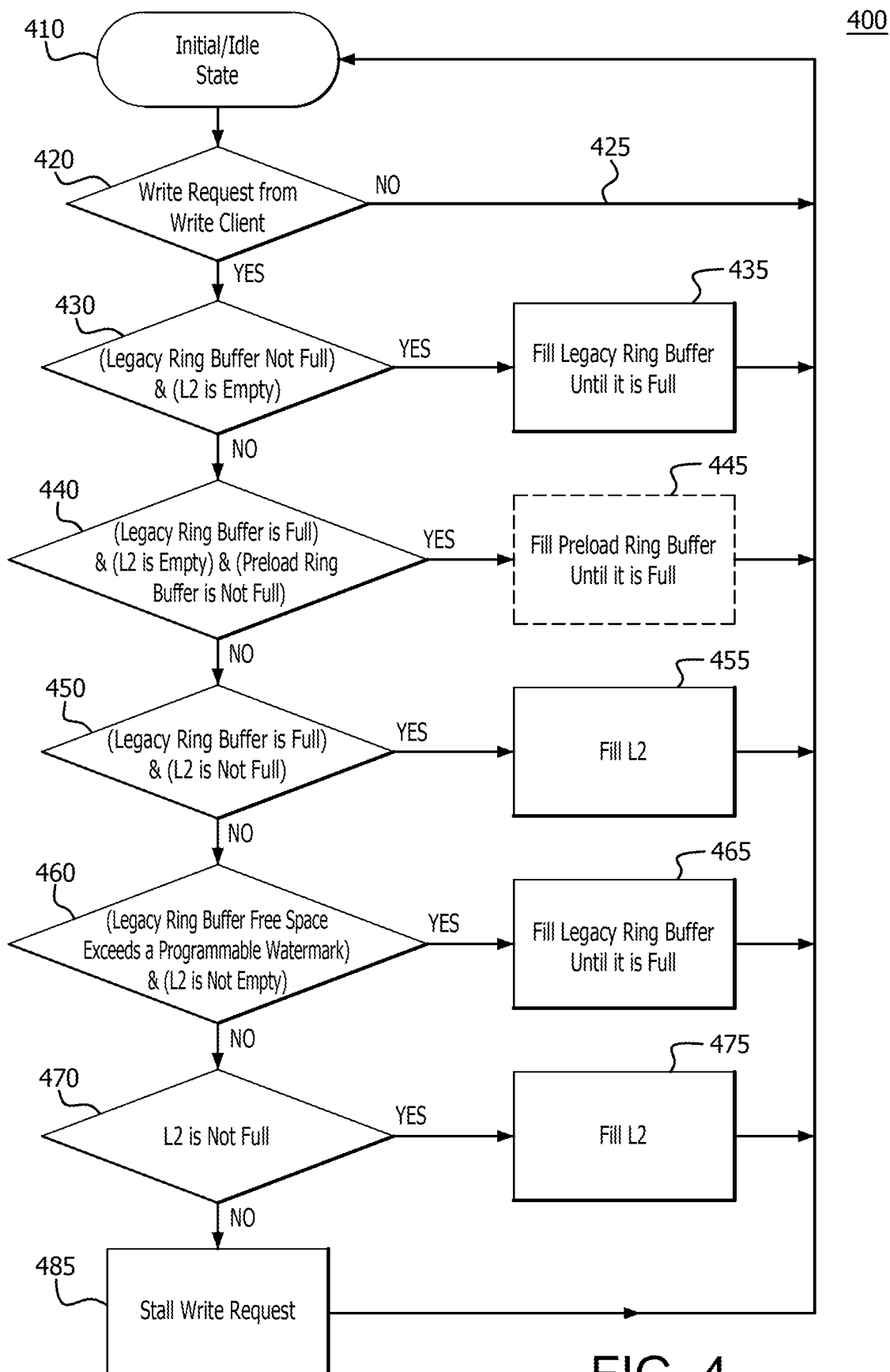
FIG. 4 illustrates another data write control flow of the ring buffer of FIG. 2.

FIG. 4 illustrates another data write control flow 400 of the ring buffer 200 of FIG. 2. Flow 400 is utilized when previous date write from write client is written to preload ring buffer 230 to further decrease L2 cache 260 accesses. That is, anytime there is no data in L2 cache 260 and the preload ring buffer 230 is not full, the write controller 270 writes data directly to preload ring buffer 230. More specifically, at step 410, flow 400 begins with an initial or idle state to wait for a write request. At step 420, a determination is made if the write request from the write client is written. If this determination 420 is NO at block 425, flow 400 returns to step 410.

If the determination 420 is YES, then step 430 is performed to allow flow 400 to control when a write client stores data to ring buffer 200 by deciding if the legacy ring buffer 250 is not full and L2 cache 260 is empty. If decision 430 is YES, the data write is directed to the legacy ring buffer 250 until the legacy ring buffer 250 is full at step 435.

If decision 430 is NO, then a determination at step 440 of whether the legacy ring buffer 250 is full, L2 cache 260 is empty, and preload ring buffer 230 is not full is made. If decision 440 is YES, the data write is directed to the preload ring buffer 230 until the preload ring buffer 230 is full at step 445.

If decision 440 is NO, then a determination at step 450 is made to decide if the legacy ring buffer 250 is full, i.e., when one data block cannot be written, and L2 cache 260 is not full. If determination 450 is YES, the data write is directed to the L2 cache 260 at step 455.

If determination 450 is NO, a determination is made at step 460 to decide if the legacy ring buffer 250 free space exceeds a programmable watermark and L2 cache 260 is not empty. If determination 460 is YES, the data write is directed to the legacy ring buffer 250 until legacy ring buffer 250 is full at step 465.

If determination 460 is NO, a determination of whether L2 cache 260 is not full may be performed at step 470. If determination 470 is YES, the data write is directed to L2 cache 260 at step 475. If determination 470 is NO the write request may be stalled at step 485.

Figure 5:
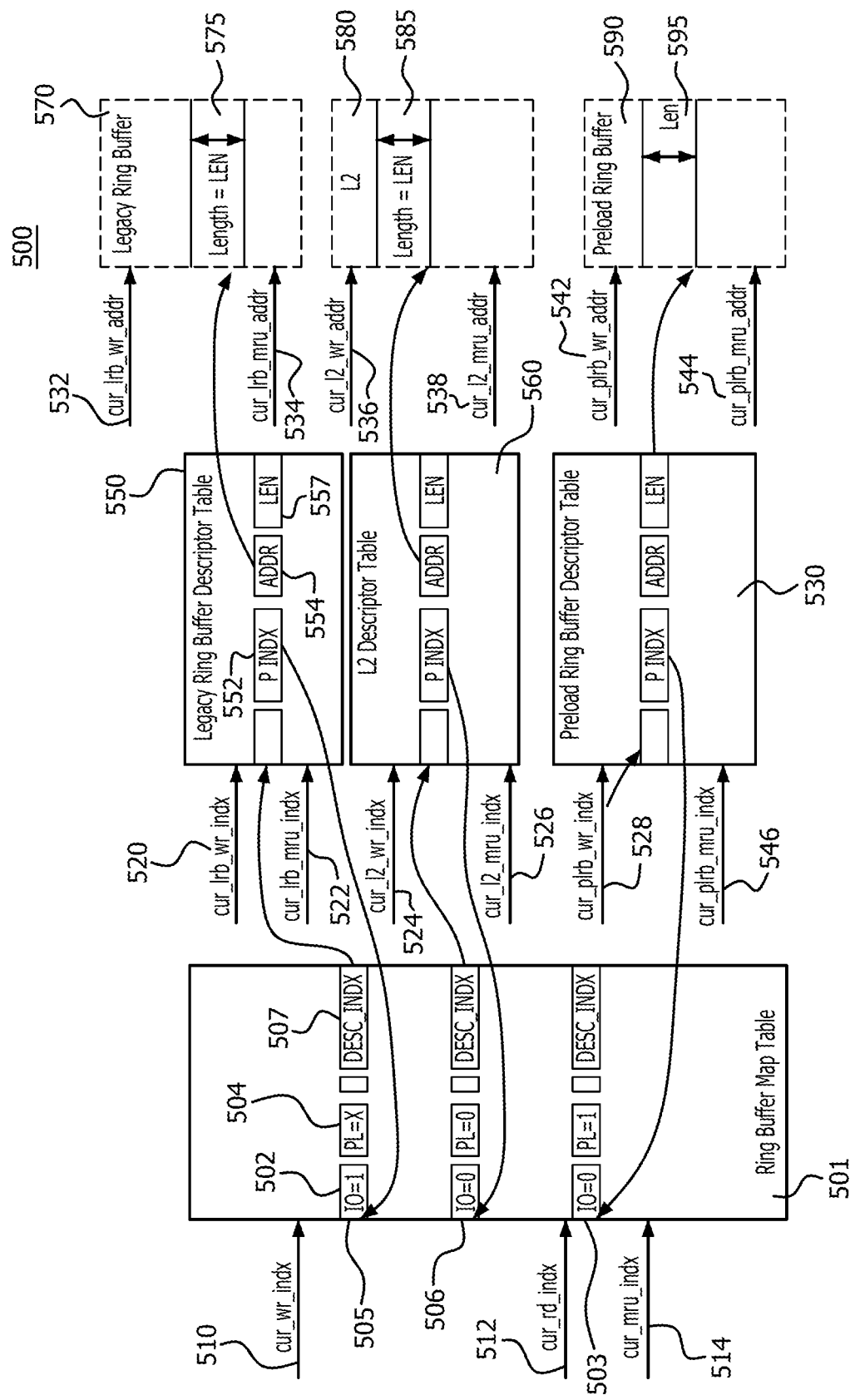
FIG. 5 illustrates a link list for descriptor tables and data in the ring buffer of FIG. 2.

FIG. 5 illustrates a link list 500 for descriptor tables and data in ring buffer 200. A descriptor table is used to log information regarding each data block in order to manage data in legacy ring buffer 250, L2 cache 260, and preload ring buffer 230. Each data block is incrementally indexed according to the write order, such that any two consecutive data blocks can be indexed as n and n+1. The index of each data block is associated with the entry index of the descriptor table that describes the information of each data block.

By way of example, four map tables are used including one for ring buffer 200, another for legacy ring buffer 250, one for preload ring buffer 230 and another for L2 260. In an alternative implementation, these tables are combinable so that less than four are used. Continuing the example with four tables, a link list 500 shown in FIG. 5 is used. Link list 500 includes a ring buffer map table 501 linked to a legacy ring buffer descriptor table 550, a L2 descriptor table 560, and a preload ring buffer descriptor table 530.

Memory location 570, for ease of description and understanding, is a part of legacy ring buffer 250 and has a length LEN 575. Memory location 580 is part of L2 cache 260 and has a length LEN 585. Memory location 590 is part of preload ring buffer 230 and has a length LEN 595. Each of tables 550, 560, 530 is linked to memory location 570, 580, 590, respectively.

One data block is associated with one descriptor, corresponding to one entry in corresponding tables as will be described. Cur_wr_indx 510 is the index functioning as the current write index that records latest write data block associated index. Cur_rd_indx 512 is the current read index from read client. The read client uses the write order index to retrieve data from ring buffer 200. Cur_mru_indx 514 is the oldest data block associated index in ring buffer 200. The "oldest" is defined as the "most recent usable" (MRU) data block.

Cur_lrb_wr_indx 520 represents the latest write data block associated descriptor index in legacy ring buffer descriptor table when that data block is stored in legacy ring buffer. Cur_lrb_rd_indx (not shown) is the read descriptor index when the data block is in legacy ring buffer. Cur_lrb_mru_indx 522 represents the oldest data block associated index in legacy ring buffer descriptor table.

Cur_l2_wr_indx 524 represents the latest write data block associated index in L2 descriptor table when that data block is stored in L2. Cur_l2_rd_indx (not shown) represents the read index in L2 descriptor table when the data block is in L2. Cur_l2_mru_indx 526 represents the oldest data block associated index in L2 descriptor table.

Cur_plrb_wr_indx 528 represents the latest write data block associated index in preload ring buffer descriptor table when that data block is stored in preload ring buffer. Cur_plrb_rd_indx (not shown) represents the read index of preload ring buffer descriptor table when the data block is in preload ring buffer. Cur_plrb_mru_indx 546 represents the oldest data block associated index in preload ring buffer descriptor table.

Cur_lrb_wr_addr 532 represents the latest write data block associated address in legacy ring buffer when it is stored in legacy ring buffer. Cur_lrb_rd_addr (not shown) represents the read address when the data block is in legacy ring buffer. Cur_lrb_mru_addr 534 represents the oldest data block associated address in legacy ring buffer.

Cur_l2_wr_addr 536 represents the latest write data block associated address when it is stored in L2. Cur_l2_rd_addr (not shown) represents the read address when the data block is in L2. Cur_l2_mru_addr 538 represents the oldest data block associated address in L2.

Cur_plrb_wr_addr 542 represents the latest write data block associated address when it is stored in preload ring buffer. Cur_plrb_rd_addr (not shown) represents the read address when the data block is in preload ring buffer. Cur_plrb_mru_addr 544 represents the oldest data block associated address in preload ring buffer.

Figure 8:
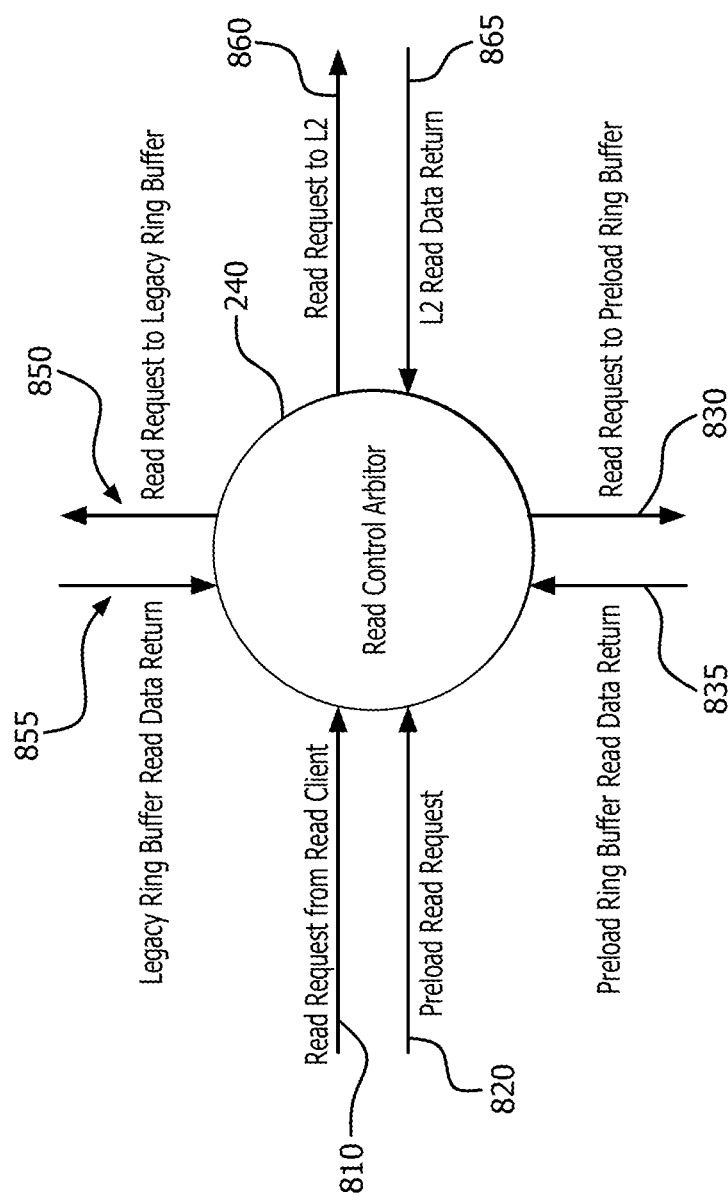
FIG. 8 illustrates the read control arbiter for the ring buffer of FIG. 2.

The read indices are not shown in FIG. 5 for purposes of clarity and are shown at least in FIG. 8. The read index to legacy ring buffer descriptor table, L2 descriptor table, and preload ring buffer descriptor table is determined by the retrieved DESC_INDX in ring buffer map table 501 using cur_rd_indx 512. One particular cur_rd_indx retrieves one particular DESC_INDX, either cur_lrb_rd_indx, cur_l2_rd_indx, or cur_plrb_rd_indx. The read data address is also determined by the retrieved DESC_INDX, either cur_lrb_rd_addr, cur_l2_rd_addr, or cur_plrb_rd_addr.

Legacy ring buffer 250, L2 260, preload ring buffer 230 are physically separately addressed. The fields of each entry of different tables are described in more detail below.

The ring buffer 200 descriptor table is represented in Table 1.

TABLE 1

Ring Buffer Descriptor Table

| Index | Bit "OBS": Data block is obsolete or not. 1: obsolete 0: in use | Bit "IO": Data block in legacy ring buffer or external L2/preload ring buffer. 1: in legacy ring buffer 0: in L2 or preload ring buffer | Bit "PL": Data block is in preload ring buffer or L2. 1: preload ring buffer 0: L2 | DESC_INDX: Descriptor table index: for legacy ring buffer, the legacy ring buffer descriptor table index. For L2, the index of L2 descriptor table For preload rig buffer, the preload ring buffer descriptor table index. |
|---|---|---|---|---|
| 0 | 1 | 1 | 0 | # |
| 1 | 0 | 1 | 0 | # |
| 2 | 0 | 0 | 0 | # |
| 3 | 1 | 0 | 0 | # |
| 4 | 0 | 1 | 0 | # |
| ... | ... | ... | ... | ... |
| n − 1 | 0 | 0 | 0 | # |
| n | 0 | 1 | 0 | # |
| n + 1 | 1 | 0 | 0 | # |
| ... | ... | ... | ... | ... |
| N | 0 | 1 | 0 | # |

The legacy ring buffer 250 descriptor table is represented in Table 2.

TABLE 2

Legacy Ring Buffer Descriptor Table

| Index | Bit "OBS": Data block is obsolete or not. 1: obsolete 0: in use | ADDR: Data block address in legacy ring buffer | LEN: One request associated data block length | Bit "REN": A read is issued or not for this index 1: a read is issued for this index 0: no previous read is issued | P_INDX: parent table index, i.e. this entry associated ring buffer map table index |
|---|---|---|---|---|---|
| 0 | 1 | ADDR [0] | LEN[0] | 0 | # |
| 1 | 0 | ADDR [1] | LEN[1] | 0 | # |
| 2 | 0 | ADDR [2] | LEN[2] | 0 | # |
| 3 | 1 | ADDR [3] | LEN[3] | 0 | # |
| 4 | 0 | ADDR [4] | LEN[4] | 0 | # |
| ... | ... | ... | ... | ... | ... |
| n − 1 | 0 | ADDR [n − 1] | LEN[n − 1] | 0 | # |
| n | 0 | ADDR [n] | LEN[n] | 0 | # |
| n + 1 | 1 | ADDR [n + 1] | LEN[n + 1] | 0 | # |
| ... | ... | ... | ... | ... | ... |
| N | 0 | ADDR [N] | LEN[N] | 0 | # |

The L2 cache 260 descriptor table is represented in Table 3.

TABLE 3

L2 Descriptor Table

| Index | Bit "OBS": data block is obsolete or not. 1: obsolete 0: in use | ADDR: Data block address in L2 | LEN: One request associated data block length | Bit "REN": A read is issued or not for this index 1: a read is issued 0: no previous read is issued | Bit "OWN": Read Data block ownership. This bit is effective only when "REN" = 1: 1: owned by read request from external read client 0: owned by preload read controller. | P_INDX: parent table index, i.e. this entry associated ring buffer map table index |
|---|---|---|---|---|---|---|
| 0 | 1 | ADDR [0] | LEN [0] | 1 | 1 | # |
| 1 | 0 | ADDR [1] | LEN [1] | 0 | 0 | # |
| 2 | 0 | ADDR [2] | LEN [2] | 0 | 0 | # |

TABLE 3-continued

L2 Descriptor Table

| Index | Bit "OBS": data block is obsolete or not. 1: obsolete 0: in use | ADDR: Data block address in L2 | LEN: One request associated data block length | Bit "REN": A read is issued or not for this index 1: a read is issued for this index 0: no previous data block read is issued | Bit "OWN": Read Data block ownership. This bit is effective only when "REN" = 1: 1: owned by read request from external read client 0: owned by preload read controller. | P_INDX: parent table index, i.e. this entry associated ring buffer map table index |
|---|---|---|---|---|---|---|
| 3 | 1 | ADDR [3] | LEN [3] | 1 | 1 | # |
| 4 | 0 | ADDR [4] | LEN [4] | 0 | 0 | # |
| ... | ... | ... | ... | ... | ... | ... |
| n − 1 | 0 | ADDR [n − 1] | LEN [n − 1] | 0 | 0 | # |
| n | 0 | ADDR [n] | LEN [n] | 0 | 0 | # |
| n + 1 | 1 | ADDR [n + 1] | LEN [n + 1] | 1 | 1 | # |
| ... | ... | ... | ... | ... | ... | ... |
| N | 0 | ADDR [N] | LEN [N] | 0 | 0 | # |

The preload ring buffer 230 descriptor table is represented in Table 4.

TABLE 4

Preload Ring Buffer Descriptor Table

| Index | Bit "OBS": Data block is obsolete or not. 1: obsolete 0: in use | ADDR: Data block address in L2 | LEN: One request associated data block length | Bit "REN": A read is issued or not for this index 1: a read is issued for this index 0: no previous read is issued | P_INDX: parent table index, i.e. this entry associated ring buffer map table index |
|---|---|---|---|---|---|
| 0 | 1 | ADDR [0] | LEN[0] | 0 | # |
| 1 | 0 | ADDR [1] | LEN[1] | 0 | # |
| 2 | 0 | ADDR [2] | LEN[2] | 0 | # |
| 3 | 1 | ADDR [3] | LEN[3] | 0 | # |
| 4 | 0 | ADDR [4] | LEN[4] | 0 | # |
| ... | ... | ... | ... | ... | ... |
| n − 1 | 0 | ADDR [n − 1] | LEN[n − 1] | 0 | # |
| n | 0 | ADDR [n] | LEN[n] | 0 | # |
| n + 1 | 1 | ADDR [n + 1] | LEN[n + 1] | 0 | # |
| ... | ... | ... | ... | ... | ... |
| N | 0 | ADDR [N] | LEN[N] | 0 | # |

In Tables 1-4, "N" denotes the maximum entry index.

Figure 6A:
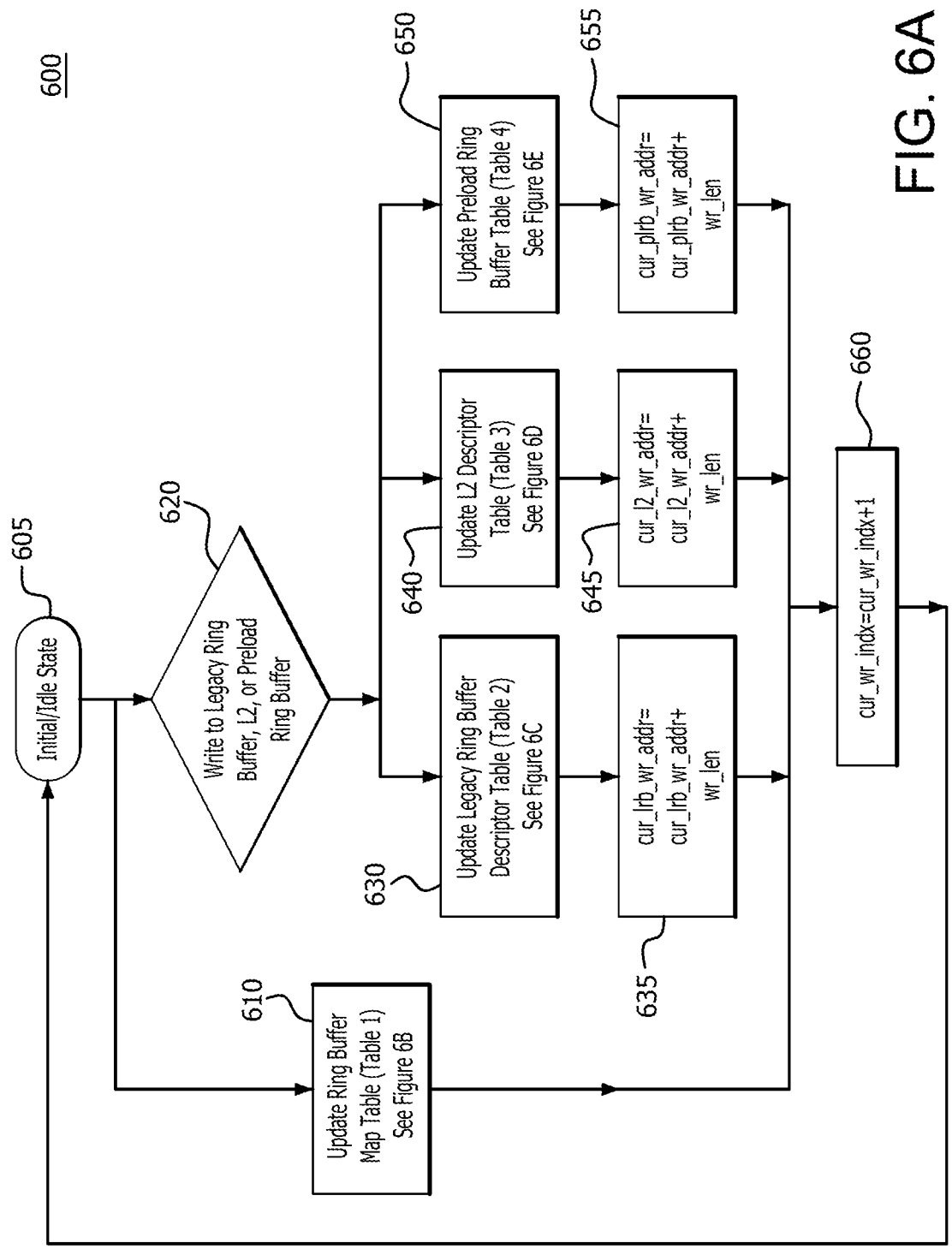
FIG. 6A illustrates method for updating the write data associated management information of the ring buffer of FIG. 2.

FIG. 6A illustrates method 600 for updating the write data associated management information of ring buffer 200. When the write controller acknowledges each request from the write client (see FIG. 2), Tables 1-4 are updated according to method 600 of FIG. 6A.

Method 600 starts with step 605 at an initial or idle state to wait for a write request. The ring buffer map table (depicted above in Table 1) is updated at step 610. A more detailed explanation of the updating of the ring buffer map table is included below with respect to FIG. 6B. A decision is made, at step 620, to write to legacy ring buffer 250, L2 260, or preload ring buffer 230 in accordance with FIGS. 3 and 4 and the associated description.

Once the decision is made where the write is occurring, method 600 continues to step 630 if the decision is to write to legacy ring buffer 250, to step 640 if the decision is to write to L2 260, or to step 650 if the decision is to write to preload ring buffer 230.

Step 630 includes updating the legacy ring buffer descriptor table (depicted above in Table 2). A more detailed explanation of the updating of the legacy ring buffer descriptor table is included below with respect to FIG. 6C. Once the updating is complete in step 630, cur_lrb_wr_addr is set equal to cur_lrb_wr_addr+wr_len at step 635.

Step 640 includes updating the L2 descriptor table (depicted above in Table 3). A more detailed explanation of the updating of the L2 descriptor table is included below with respect to FIG. 6D. Once the updating is complete in step 640, cur_l2_wr_addr is set equal to cur_l2_wr_addr+wr_len at step 645.

Step 650 includes updating the preload ring buffer descriptor table (depicted above in Table 4). A more detailed explanation of the updating of the preload ring buffer descriptor table is included below with respect to FIG. 6E. Once the updating is complete in step 650, cur_plrb_wr_addr is set equal to cur_plrb_wr_addr+wr_len at step 655.

Method 600 concludes with setting cur_wr_indx equal to cur_wr_indx+1 to complete the write. In an implementation, method 600 is performed again for subsequent writes.

Figure 6B:
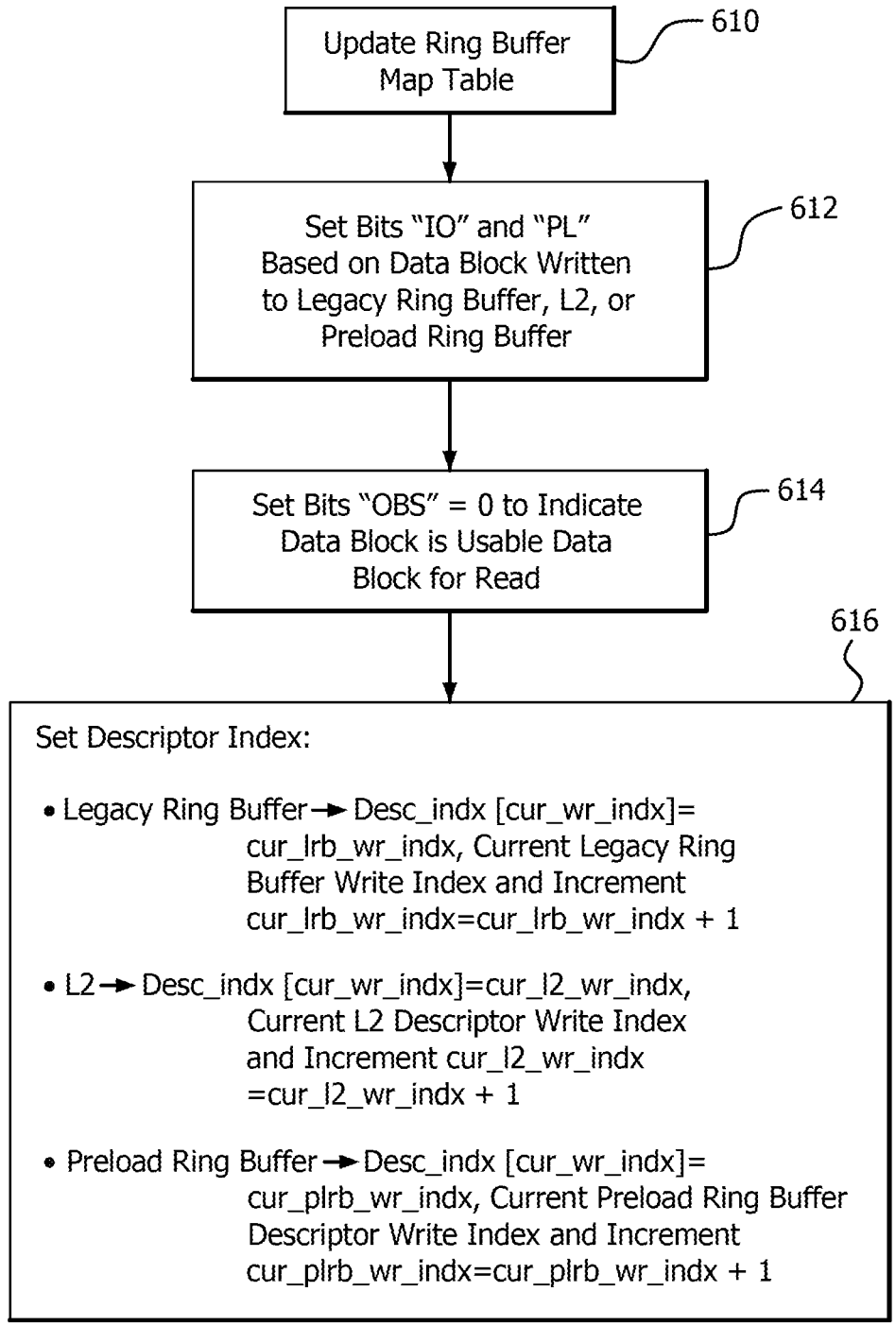
FIG. 6B illustrates the steps of updating the ring buffer map table associated with FIG. 6A.

FIG. 6B illustrates the steps of updating the ring buffer map table starting at step 610. At step 612 the "IO" and "PL"

bits are set based on data block written to legacy ring buffer 250, L2 260, or preload ring buffer 230. At step 614 "OBS" is set equal to 0 to indicate that the data block is usable data block for reading. At step 616, the descriptor index (DESC_INDX) is set according to the storage that is being utilized.

For the legacy ring buffer, at step 616 the descriptor index (DESC_INDX) (cur_wr_indx) is set to cur_lrb_wr_indx, current legacy ring buffer write index. Additionally, an increment is added by setting cur_lrb_wr_indx=cur_lrb_wr_indx+1.

For L2, at step 616 the descriptor index (DESC_INDX) (cur_wr_indx) is set to cur_l2_wr_indx, current L2 descriptor write index. Additionally, an increment is added by setting cur_l2_wr_indx=cur_l2_wr_indx+1.

For preload ring buffer, at step 616 the descriptor index (DESC_INDX) (cur_wr_indx) is set to cur_plrb_wr_indx, current preload ring buffer descriptor write index. Additionally, an increment is added by setting cur_plrb_wr_indx=cur_plrb_wr_indx+1.

Figure 6C:
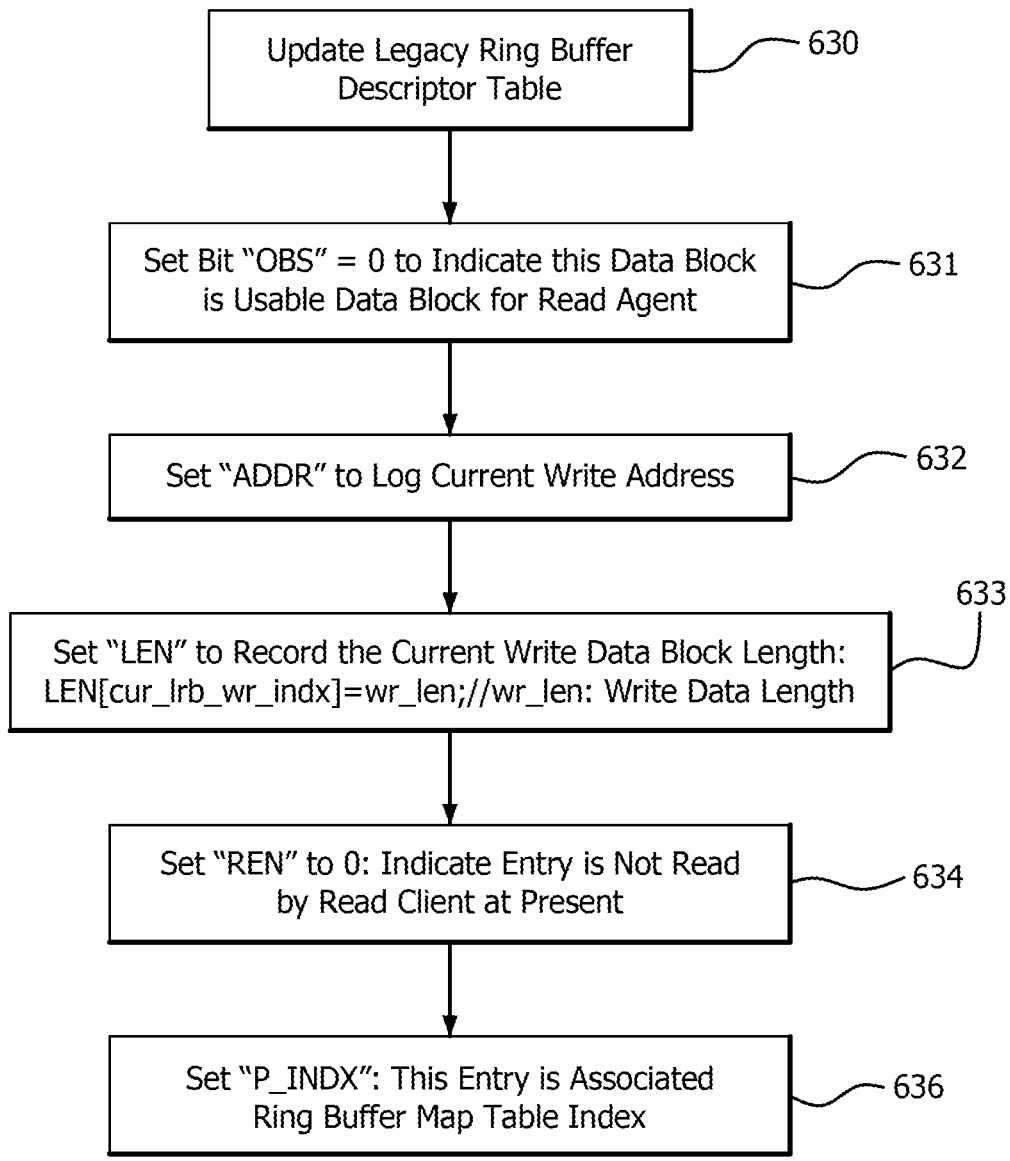
FIG. 6C illustrates the steps of updating the legacy ring buffer descriptor table associated with FIG. 6A.

FIG. 6C illustrates the steps of updating the legacy ring buffer descriptor table starting at step 630. At step 631, the "OBS" bit is set to 0 to indicate that the data block is usable for reading. At step 632, the "ADDR" is set to log current write address. For example, ADDR[cur_lrb_wr_indx]=cur_lrb_wr_addr where cur_lrb_wr_indx is the current legacy ring buffer write index and cur_lrb_wr_addr is the current legacy ring buffer data block write address.

At step 633, "LEN" is set to record the current write data block length where LEN[cur_lrb_wr_indx] is equal to wr_len and wr_len is the write data length. At step 634, "REN" is set to 0 to indicate entry is not read by read client at present. At step 636, "P_INDX" is set to indicate the legacy ring buffer in the associated ring buffer map table index (e.g., cur_wr_indx).

Figure 6D:
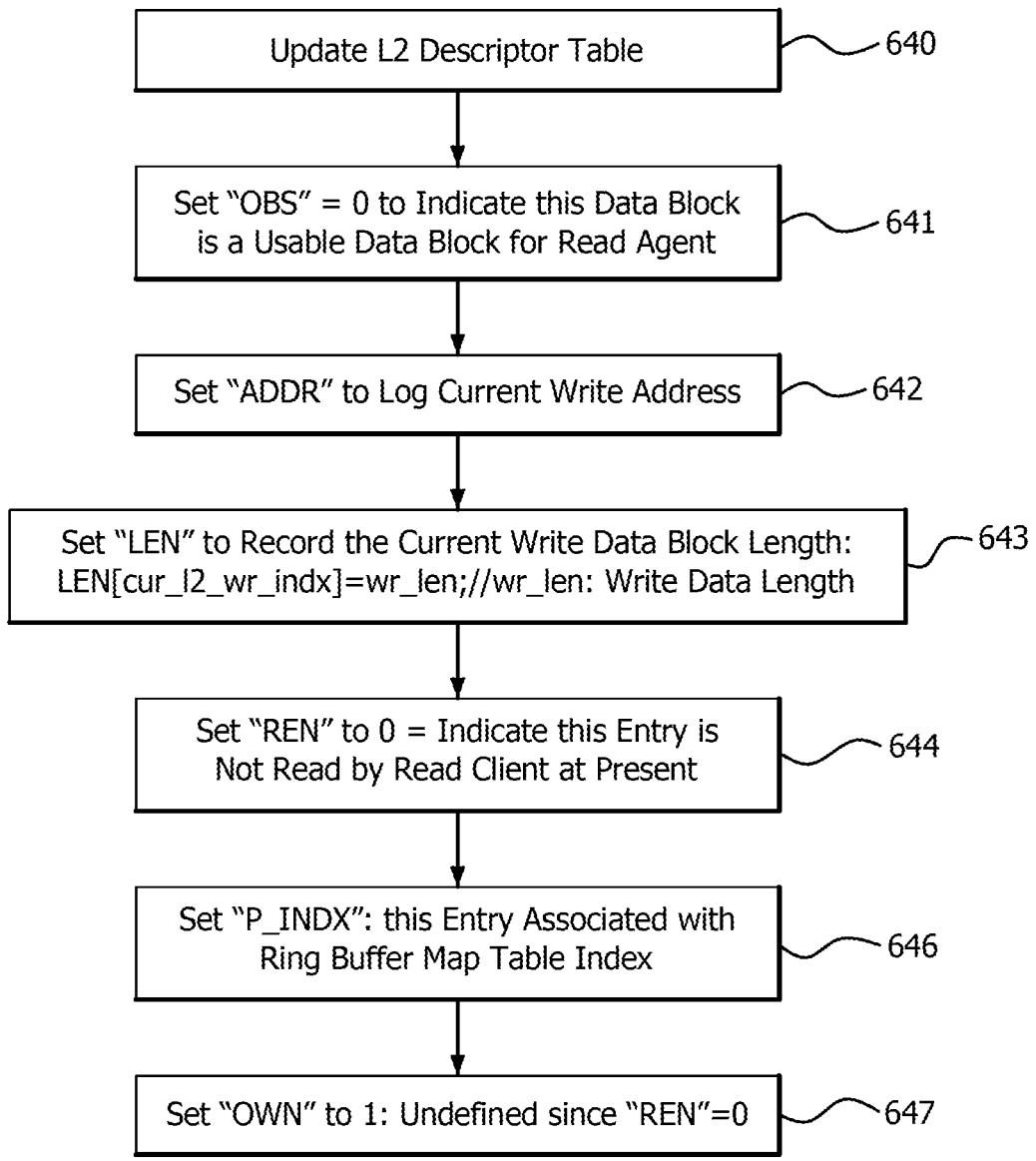
FIG. 6D illustrates the steps of updating the L2 descriptor table associated with FIG. 6A.

FIG. 6D illustrates the steps of updating the L2 descriptor table starting at step 640. At step 641, the "OBS" bit is set to 0 to indicate that the data block is usable for reading. At step 642, the "ADDR" is set to log current write address. For example, ADDR[cur_l2_wr_indx]=cur_l2_wr_addr where cur_l2_wr_indx is the current L2 write index and cur_l2_wr_addr is the current L2 ring buffer data block write address.

At step 643, "LEN" is set to record the current write data block length where LEN[cur_l2_wr_indx] is equal to wr_len and wr_len is the write data length. At step 644, "REN" is set to 0 to indicate entry is not read by read client at present. At step 646, "P_INDX" is set to indicate the L2 in the associated ring buffer map table index (e.g., cur_wr_indx). At step 647, "OWN" is set to 1 to indicate that it is undefined since "REN"=0.

Figure 6E:
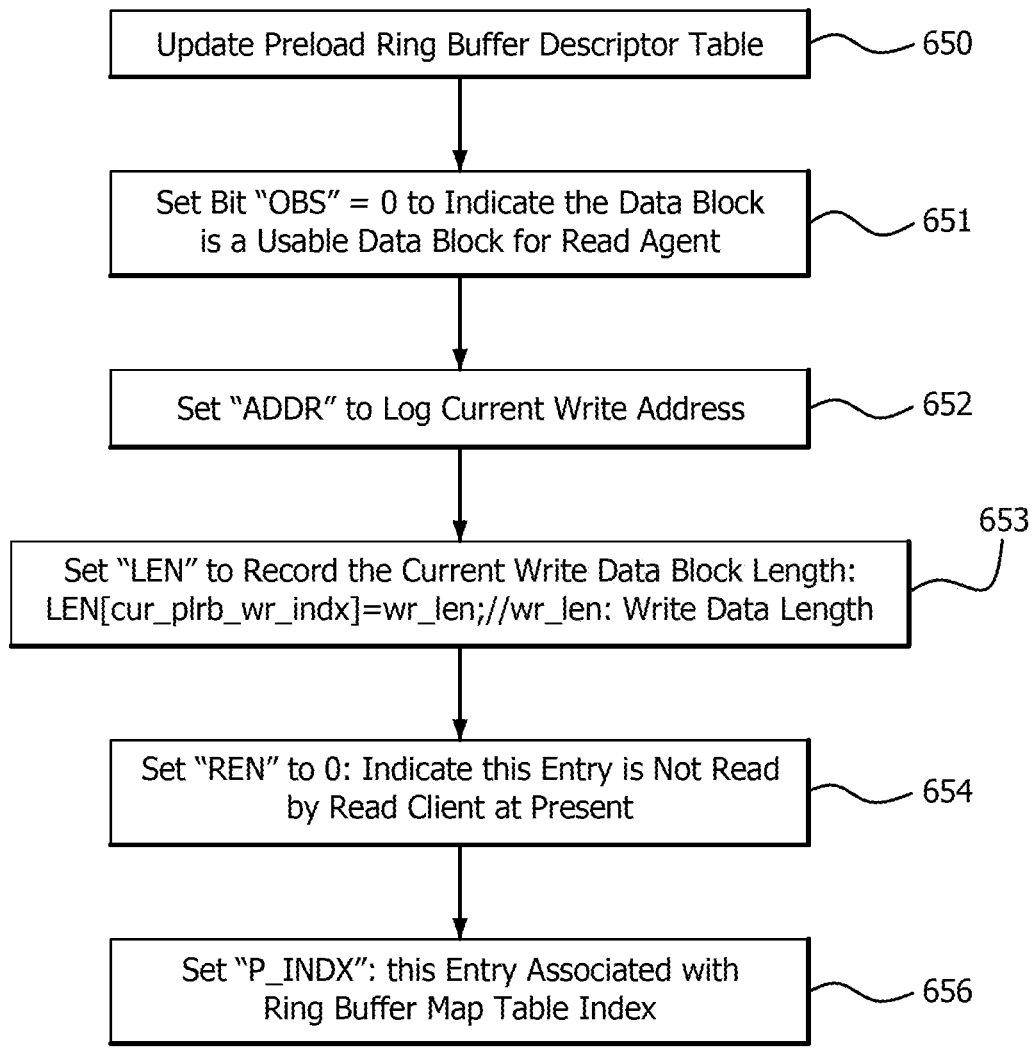
FIG. 6E illustrates the steps of updating the preload ring buffer descriptor table associated with FIG. 6A.

FIG. 6E illustrates the steps of updating the preload ring buffer descriptor table starting at step 650. At step 651, the "OBS" bit is set to 0 to indicate that the data block is usable for reading. At step 652, the "ADDR" is set to log current write address. For example, ADDR[cur_plrb_wr_indx]=cur_plrb_wr_addr where cur_plrb_wr_indx is the current preload ring buffer write index and cur_plrb_wr_addr is the current preload ring buffer data block write address.

At step 653, "LEN" is set to record the current write data block length where LEN[cur_plrb_wr_indx] is equal to wr_len and wr_len is the write data length. At step 654, "REN" is set to 0 to indicate entry is not read by read client at present. At step 656, "P_INDX" is set to indicate the preload ring buffer in the associated ring buffer map table index, for example, cur_wr_indx.

Figure 7:
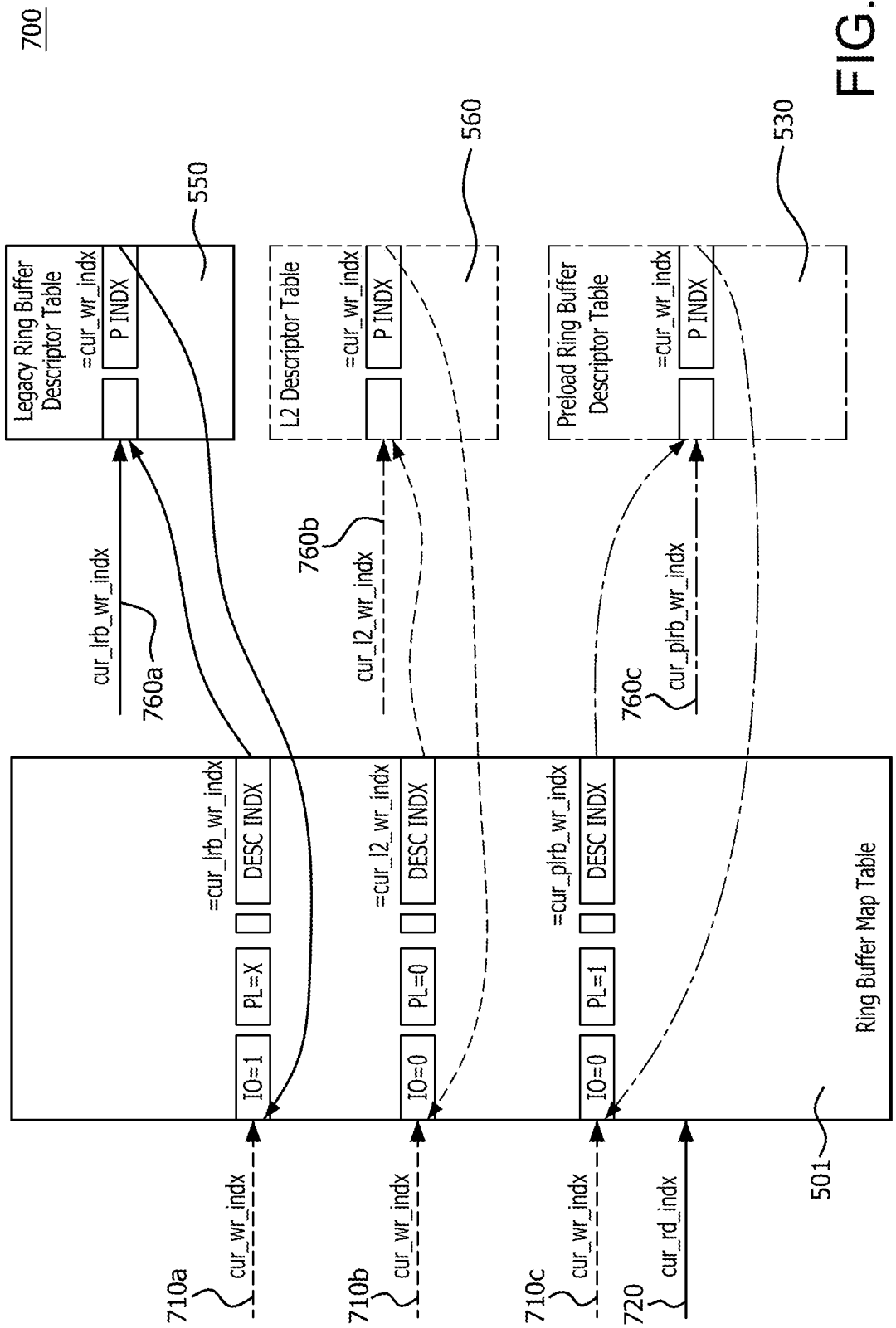
FIG. 7 illustrates management information update for write data of the ring buffer of FIG. 2.

FIG. 7 illustrates management information update for write data of the ring buffer 200. FIG. 7 depicts the three possible write scenarios of writing to legacy ring buffer descriptor table 550, to L2 descriptor table 560, and to the preload ring buffer descriptor table 530. While only a single scenario occurs at one time, FIG. 7 illustrates all three possibilities. In writing data, a write index, cur_wr_indx 710, points to a portion of ring buffer map table 501, resulting from an implementation where step 616 of FIG. 6B sets the pointer for the write index. If the write is to the legacy ring buffer 250, write index 710a is applicable. If the write is to L2 260, write index 710b applies. If the write is to the preload ring buffer 230, write index 710c applies. The read index, cur_rd_indx, 720 references another point on ring buffer map table 501.

If the legacy ring buffer 250 is determined to be the location of the write, cur_wr_indx 710a is set equal to cur_lrb_wr_indx. After setting cur_wr_indx 710a, as a result of cur_wr_indx being used as an index of DESC_INDX, cur_lrb_wr_indx is incremented by 1 as a subsequent write index using cur_wr_indx=cur_wr_indx+1 and cur_lrb_wr_indx=cur_lrb_wr_indx+1. Using the pointer for cur_lrb_wr_indx 760a (step 616 of FIG. 6B and steps 630-636 of FIG. 6C), the legacy ring buffer descriptor table 550 is accessed. After the write, the current write index is reset to cur_wr_indx in order for subsequent writes to occur.

If L2 260 is determined to be the location of the write, cur_wr_indx 710b is set equal to cur_l2_wr_indx. After setting cur_wr_indx 710b, as a result of cur_wr_indx being used as an index of DESC_INDX, cur_l2_wr_indx is incremented by 1 as a subsequent write index using cur_wr_indx=cur_wr_indx+1 and cur_l2_wr_indx=cur_l2_wr_indx+1. Using the pointer for cur_l2_wr_indx 760b (step 616 of FIG. 6B and steps 641-647 of FIG. 6D), L2 descriptor table 560 is accessed. After the write, the current write index is reset to cur_wr_indx in order for subsequent writes to occur.

If the preload ring buffer 230 is determined to be the location of the write, cur_wr_indx 710c is set equal to cur_plrb_wr_indx. After setting cur_wr_indx 710c, as a result of cur_wr_indx being used as an index of DESC_INDX, cur_plrb_wr_indx is incremented by 1 as a subsequent write index using cur_wr_indx=cur_wr_indx+1 and cur_plrb_wr_indx=cur_plrb_wr_indx+1. Using the pointer for cur_plrb_wr_indx 760c (step 616 of FIG. 6B and steps 650-656 of FIG. 6E), the preload ring buffer descriptor table 530 is accessed. After the write, the current write index is reset to cur_wr_indx in order for subsequent writes to occur.

FIG. 8 illustrates the read control arbitor 240 for the ring buffer of FIG. 2. There are two sources of read request for read control arbitor 240. A read request either comes from a read client 810 or there is a preload read request 820. Read control arbitor 240 arbitrates between these requests to manage the data. Read requests are sent from read control arbitor 240 to the legacy ring buffer via read request to legacy ring buffer 850, to L2 via read request to L2 860, and to preload ring buffer via read request to preload ring buffer 830. Data is returned to read control arbitor 240 from the legacy ring buffer via legacy ring buffer read data return 855, from L2 via L2 read data return 865, and from preload ring buffer via preload ring buffer read data return 835.

Figure 9:
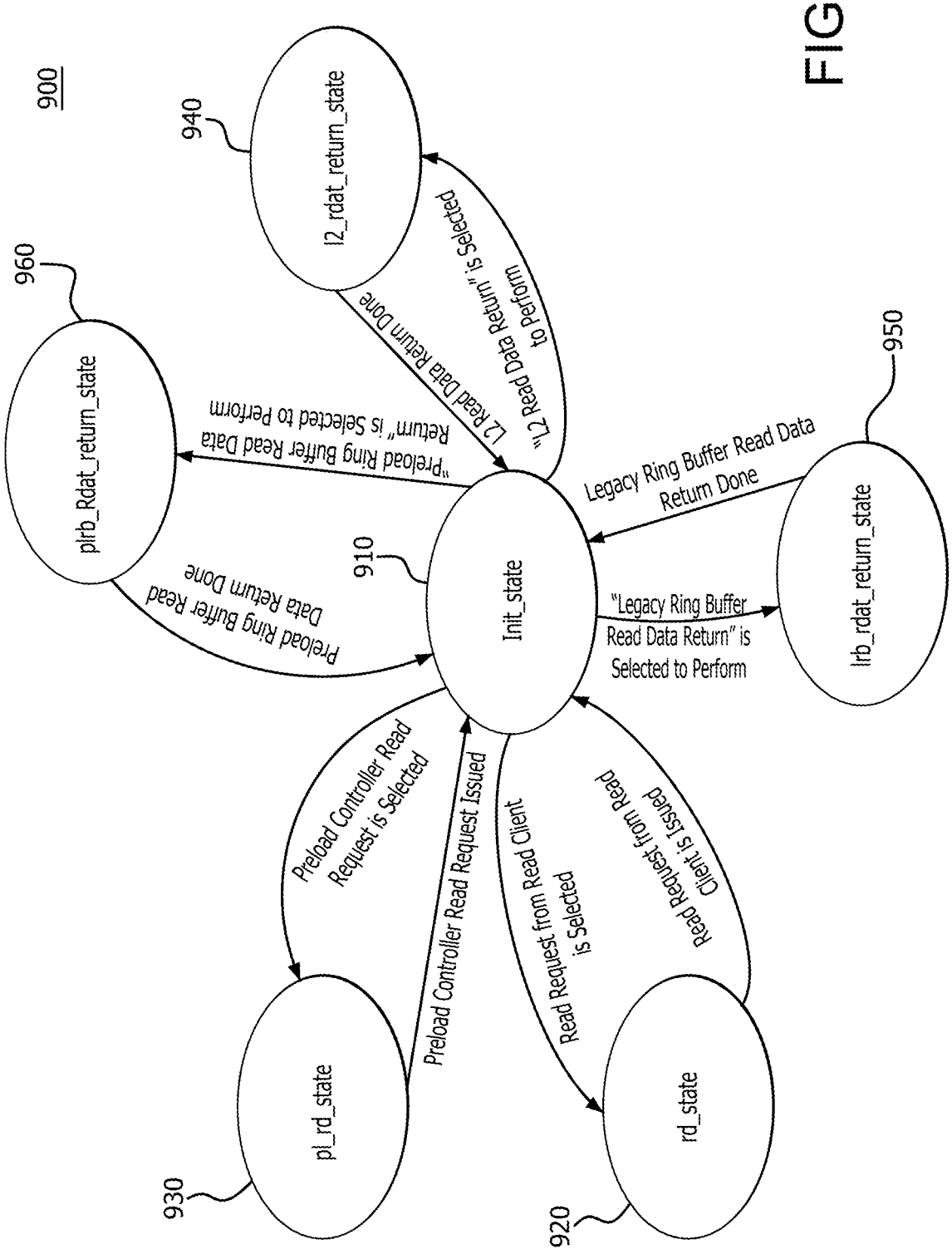
FIG. 9 illustrates a read control arbitration finite state machine (FSM) to arbitrate the reads in the ring buffer of FIG. 2.

FIG. 9 illustrates a read control arbitration finite state machine (FSM) that is used to arbitrate the reads. FSM 900 includes an initial state denoted as init_state 910. The state where read request from read client is acknowledged is denoted as rd_state 920. The state where preload condition is met, the preload is initiated with read controller request is acknowledged and denoted as pl_rd_state 930. The state where read data is returned from L2 is denoted as l2_rdat_return_state 940. The state where read data is returned from legacy ring buffer is denoted as lrb_rdat_return_state 950. The state where read data is return from preload ring buffer is denoted as plrb_rdat_return_state 960.

From init_state 910 FSM 900 moves to any one of the other states rd_state 920, pl_rd_state 930, l2_rdat_return_state 940, lrb_rdat_return_state 950, and plrb_rdat_return_state 960.

A read request from a read client causes rd_state 920 to be selected as the state until a read request from read client is issued causing the state to return to init_state 910. The selection of a preload controller read request causes pl_rd_state 930 to be selected as the state until a preload controller read request is issued causing the state to return to init_state 910. The selection of a L2 read data causes l2_rdat_return_state 940 to be selected as the state until a L2 read data return is completed causing the state to return to init_state 910. The selection of a legacy ring buffer read data causes lrb_rdat_return_state 950 to be selected as the state until a legacy ring buffer data return is completed causing the state to return to init_state 910. The selection of a preload ring buffer read data causes plrb_rdat_return_state 960 to be selected as the state until a preload ring buffer read data return is completed causing the state to return to init_state 910. FSM 900 controls which client has exclusive access to the tables. Each time an access occurs, the access finishes atomically. In an implementation, init_state 910 uses a round-robin selector to select which request is to be acknowledged and acted upon.

Figure 10:
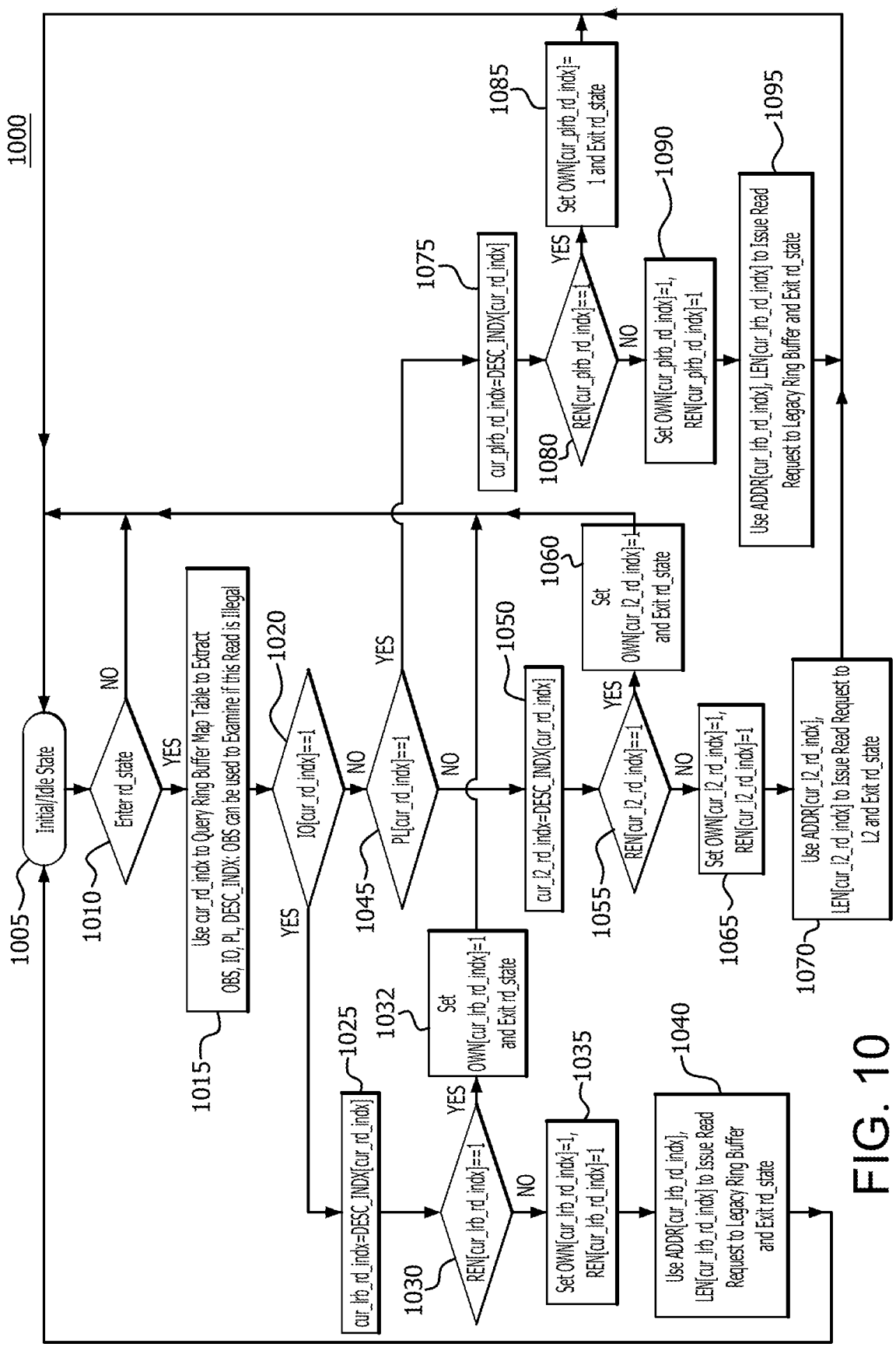
FIG. 10 illustrates the method of operations in state rd_state of FSM of FIG. 9.

FIG. 10 illustrates the method 1000 of operations in state rd_state 920 of FSM 900 of FIG. 9. Method 1000 begins at step 1005 with an initial or idle state to wait for a read request. At step 1010, a decision about entering rd_state 920 occurs. If the state is not entered, method 1000 loops back to step 1005. If rd_state 920 is entered, then at step 1015 the cur_rd_indx is used to query ring buffer map table to extract OBS, IO, PL, and DESC_INDX where OBS can be used to examine if the read is acceptable. After these variables are extracted, a determination if IO[cur_rd_indx]=1 is made at step 1020. If this determination is positive, cur_lrb_rd_indx=DESC_INDX[cur_rd_indx] at step 1025. After step 1025, at step 1030 a determination of the value of REN[cur_lrb_rd_indx] is compared to 1. If this value is not 1, method 1000 sets OWN[cur_lrb_rd_indx]=1 and exits rd_state at step 1032 returning to step 1005. If the determination is that the value is 1, then at step 1035 OWN[cur_lrb_rd_indx] is set to 1 and REN[cur_lrb_rd_indx] is set to 1. At step 1040, ADDR[cur_lrb_rd_indx] and LEN[cur_lrb_rd_indx] are used to issue read request to legacy ring buffer 250 and exit rd_state 920.

If the determination at step 1020 is negative, a determination of whether PL[cur_rd_indx]=1 is made at step 1045. If this determination is negative, then cur_l2_rd_indx is set equal to DESC_INDX[cur_rd_indx] at step 1050. At step 1055 a determination is made as to whether REN[cur_l2_rd_indx] equals 1. If that determination is positive, then OWN[cur_l2_rd_indx] is set to 1 and rd_state 920 is exited at step 1060. If the determination at step 1055 is negative OWN[cur_l2_rd_indx] and REN[cur_l2_rd_indx] are each set to 1 at step 1065. At step 1070, ADDR[cur_l2_rd_indx] and LEN[cur_l2_rd_indx] are used to issue a read request to L2 260 and rd_state 920 is exited.

If the determination at step 1045 is positive, then at step 1075 cur_plrb_rd_indx is set to DESC_INDX[cur_rd_indx].

At step 1080 a determination of whether OWN[cur_plrb_rd_indx] is equal to 1. If the determination is positive, then OWN[cur_plrb_rd_indx] is set to 1 and rd_state 920 is exited at step 1085. If the determination at step 1080 is negative, OWN[cur_plrb_rd_indx] and REN[cur_plrb_rd_indx] are set equal to 1 at step 1090. At step 1095, ADDR[cur_lrb_rd_indx] and LEN[cur_lrb_rd_indx] are used to issue read request to legacy ring buffer 250 and rd_state 920 is exited.

Figure 11:
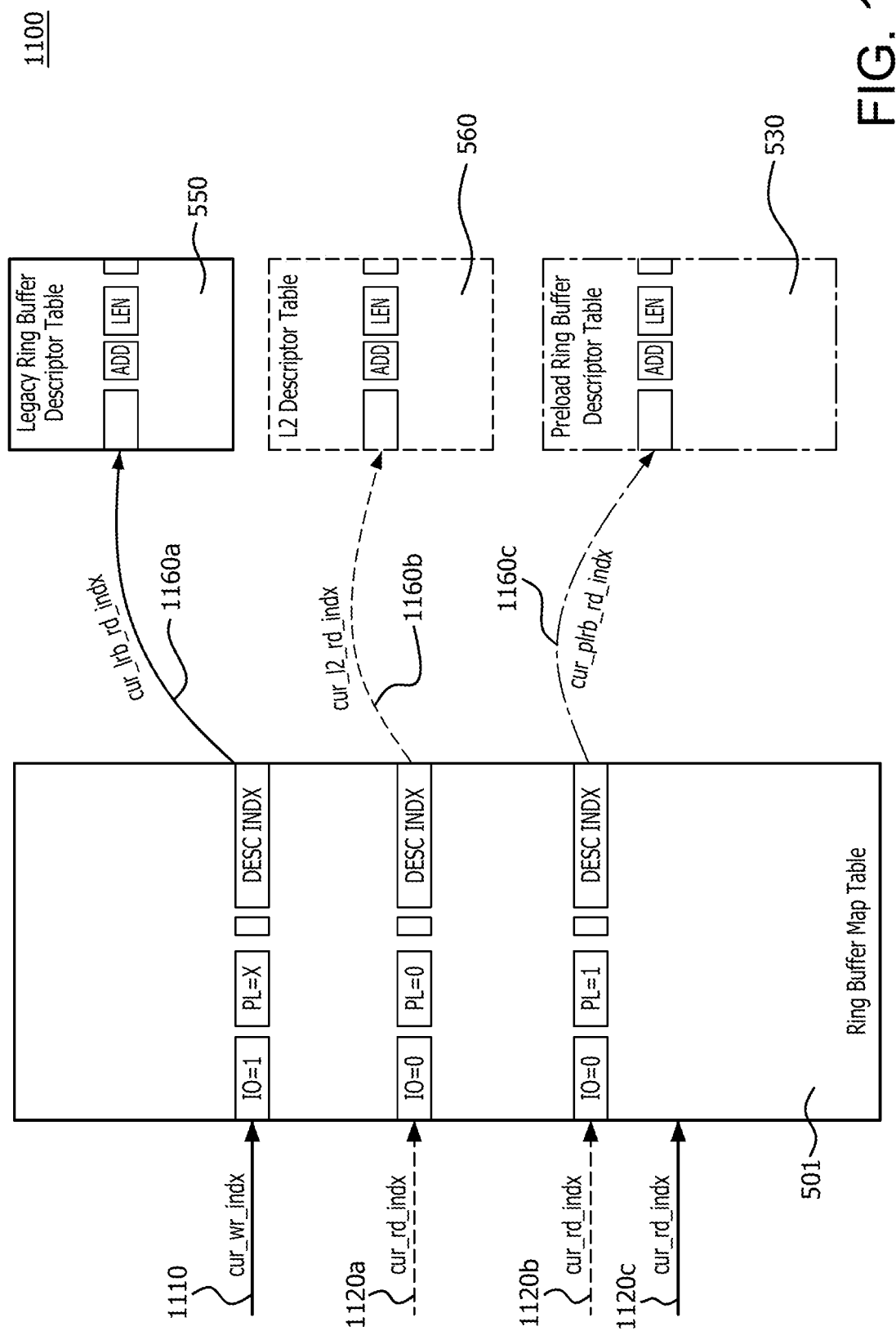
FIG. 11 illustrates management information extraction and update in rd_state.

FIG. 11 illustrates management information extraction and update in rd_state 920. FIG. 11 depicts the three possible read scenarios of reading from legacy ring buffer descriptor table 550, to L2 descriptor table 560, and to the preload ring buffer descriptor table 530. While only a single scenario occurs at one time, FIG. 11 is shown to illustrate all three possibilities. In reading data to satisfy a read request, the data is read from one of three locations within the ring buffer as described herein. In reading data a write index, cur_wr_indx 1110 points to a portion of ring buffer map table 501. The read index, cur_rd_indx 1120 references another point on ring buffer map table 501. In the case where the read is from the legacy ring buffer 250 (step 1025 from FIG. 10), read index 1120*a* applies. If the read is from L2 260 (step 1050 from FIG. 10), read index 1120*b* applies. If the read is from the preload ring buffer 230 (step 1075 from FIG. 10), read index 1120*c* applies.

If the legacy ring buffer 250 is determined to be the location where the data to be read is located, cur_rd_indx 1120*a* is set equal to cur_lrb_rd_indx and using the pointer for cur_lrb_rd_indx 1160*a*, the legacy ring buffer descriptor table 550 is accessed.

If L2 260 is determined to be the location where the data to be read is located, cur_rd_indx 1120*b* is set equal to cur_l2_rd_indx and using the pointer for cur_l2_rd_indx 1160*b*, L2 descriptor table 560 is accessed.

If the preload ring buffer 230 is determined to be the location where the data to be read is located, cur_rd_indx 1120*c* is set equal to cur_plrb_rd_indx and using the pointer for cur_plrb_rd_indx 1160*c* the preload ring buffer descriptor table 530 is accessed.

Figure 12:
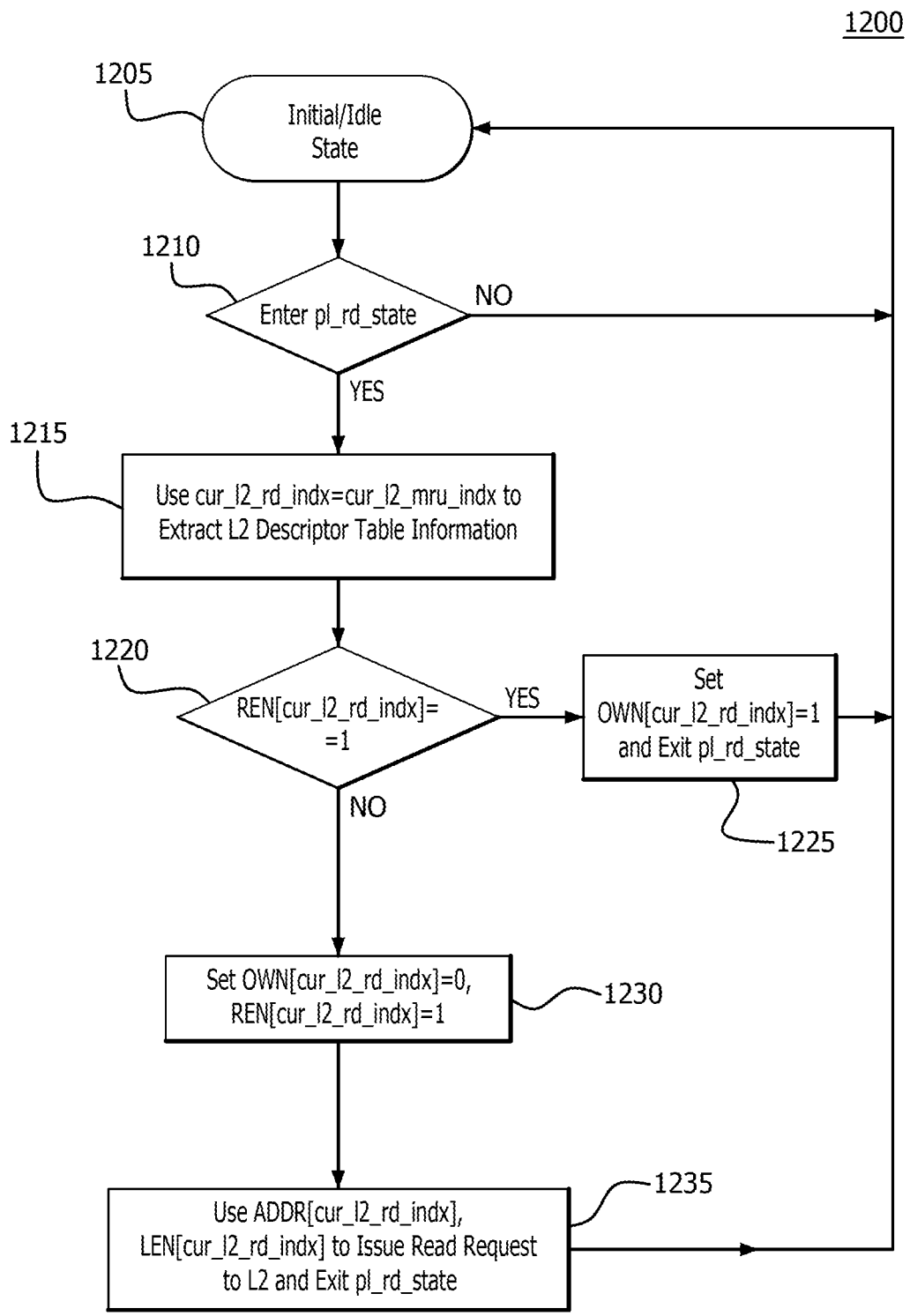
FIG. 12 illustrates the operations in state pl_rd_state of the FSM of FIG. 9.

FIG. 12 illustrates the operations in state pl_rd_state 930 of the FSM 900 of FIG. 9. Method 1200 begins at step 1205 with an initial or idle state to wait for a read request. At step 1210, a decision about entering pl_rd_state 930 occurs. If the state is not entered, method 1200 loops back to step 1205. If pl_rd_state 930 is entered, then at step 1215 the cur_l2_rd_indx=cur_l2_mru_indx is used to extract L2 descriptor table information. At step 1220 a determination is made if REN[cur_l2_rd_indx] is equal to 1. If the determination is positive, OWN[cur_l2_rd_indx] is set to 1 and pl_rd_state 930 is exited at step 1225. If the determination is negative, OWN[cur_l2_rd_indx] is set to 0 and REN[cur_l2_rd_indx] is set to 1 at step 1230. At step 1235, ADDR[cur_l2_rd_indx] and LEN[cur_l2_rd_indx] are used to issue a read request to L2 260 and pl_rd_state 930 is exited.

Figure 13:
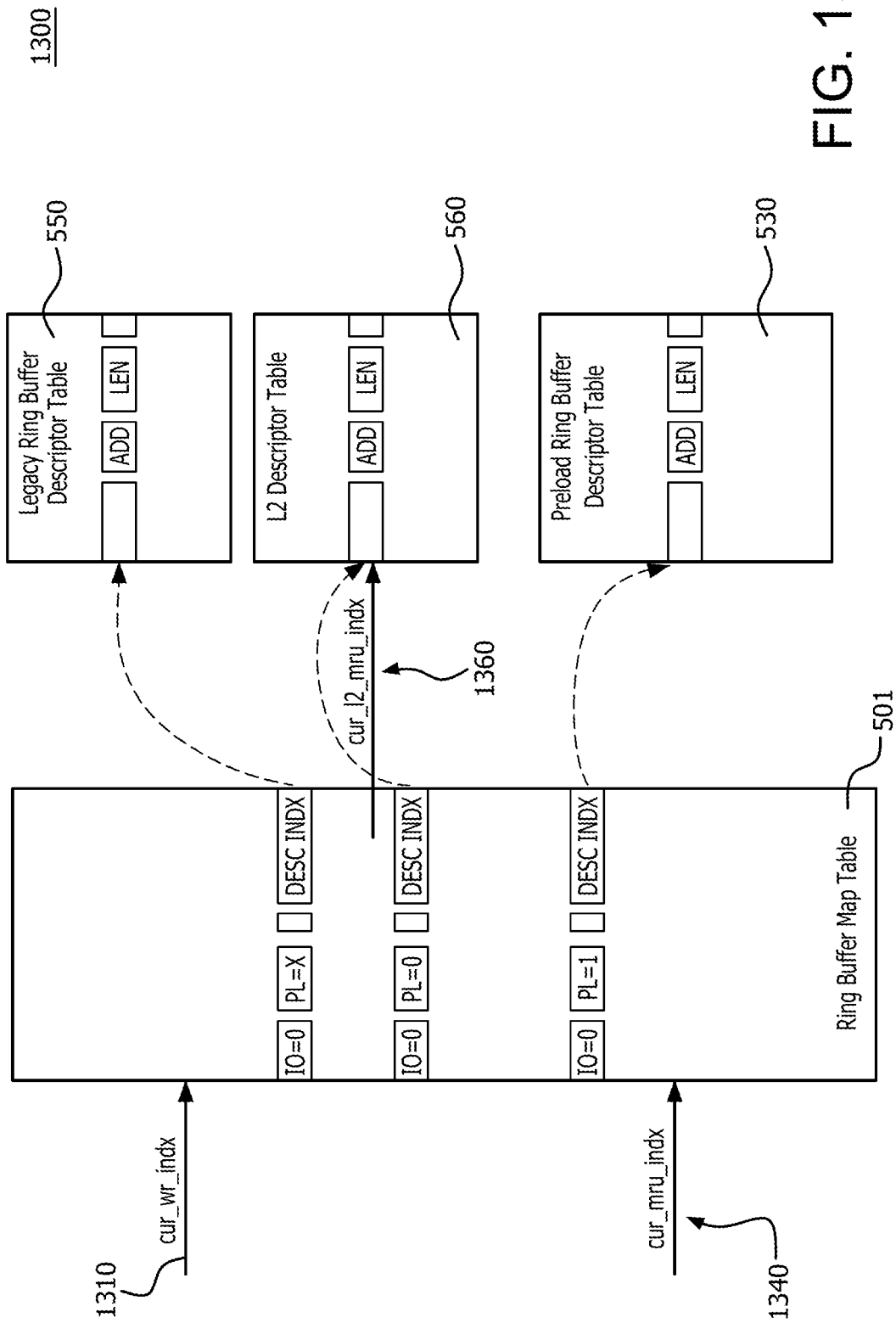
FIG. 13 illustrates management information extraction and update in pl_rd_state.

FIG. 13 illustrates management information extraction and update 1300 in pl_rd_state 930. FIG. 13 illustrates cur_wr_indx 1310 indexing the ring buffer map table 501. Cur_mru_indx 1340 also indexes the ring buffer map table 501. As pl_rd_state 930 utilizes L2 260, L2 descriptor table 560 is indexed from ring buffer map table 1340 using cur_l2_mru_indx 1360. Once cur_l2_mru_infix 1360 is calculated using cur_mr_indx 1340 or cur_rd_indx (not shown).

Figure 14:
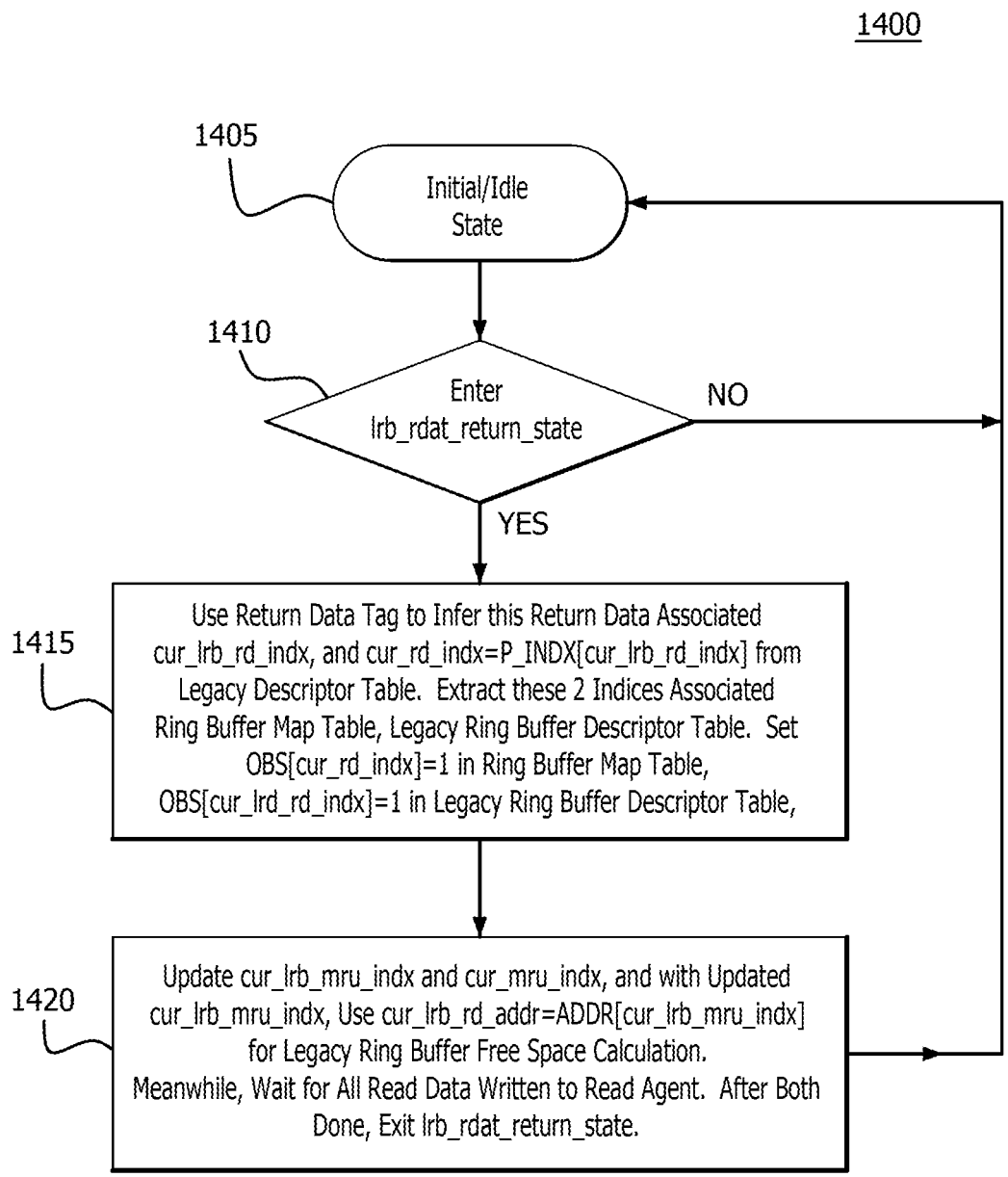
FIG. 14 illustrates the operations in state lrb_rdat_return_state of the FSM of FIG. 9.

FIG. 14 illustrates the operations in state lrb_rdat_return_state 950 of the FSM 900 of FIG. 9. Method 1400 begins at step 1405 with an initial or idle state to wait for a read data return from legacy ring buffer 250. At step 1410, a decision about entering lrb_rdat_return_state 950 occurs. If the state is not entered, method 1400 loops back to step 1405. If lrb_rdat_return_state 950 is entered, then at step 1415 the return data tag is used to infer the return data associated cur_lrb_rd_indx and cur_rd_indx is set equal to P_INDX[cur_lrb_rd_indx] from the legacy ring buffer descriptor table. At step 1415, OBS[cur_rd_indx] and OBS [cur_lrd_rd_indx] is extracted from the ring buffer map table and the legacy ring buffer descriptor table, respectively. OBS[cur_rd_indx] is set equal to 1 in the ring buffer map table and OBS[cur_lrd_rd_indx] is set equal to 1 in the legacy ring buffer descriptor table. At step 1420, cur_lrb_mru_indx and cur_mru_indx are updated, when necessary, with cur_lrb_mru_indx to obtain cur_lrb_rd_addr=ADDR[cur_lrb_mru_indx] and then cur_lrb_addr is used for legacy ring buffer free space calculation. Once all of the read data is written to the read agent, lrb_rdat_return_state 950 is exited.

Figure 15:
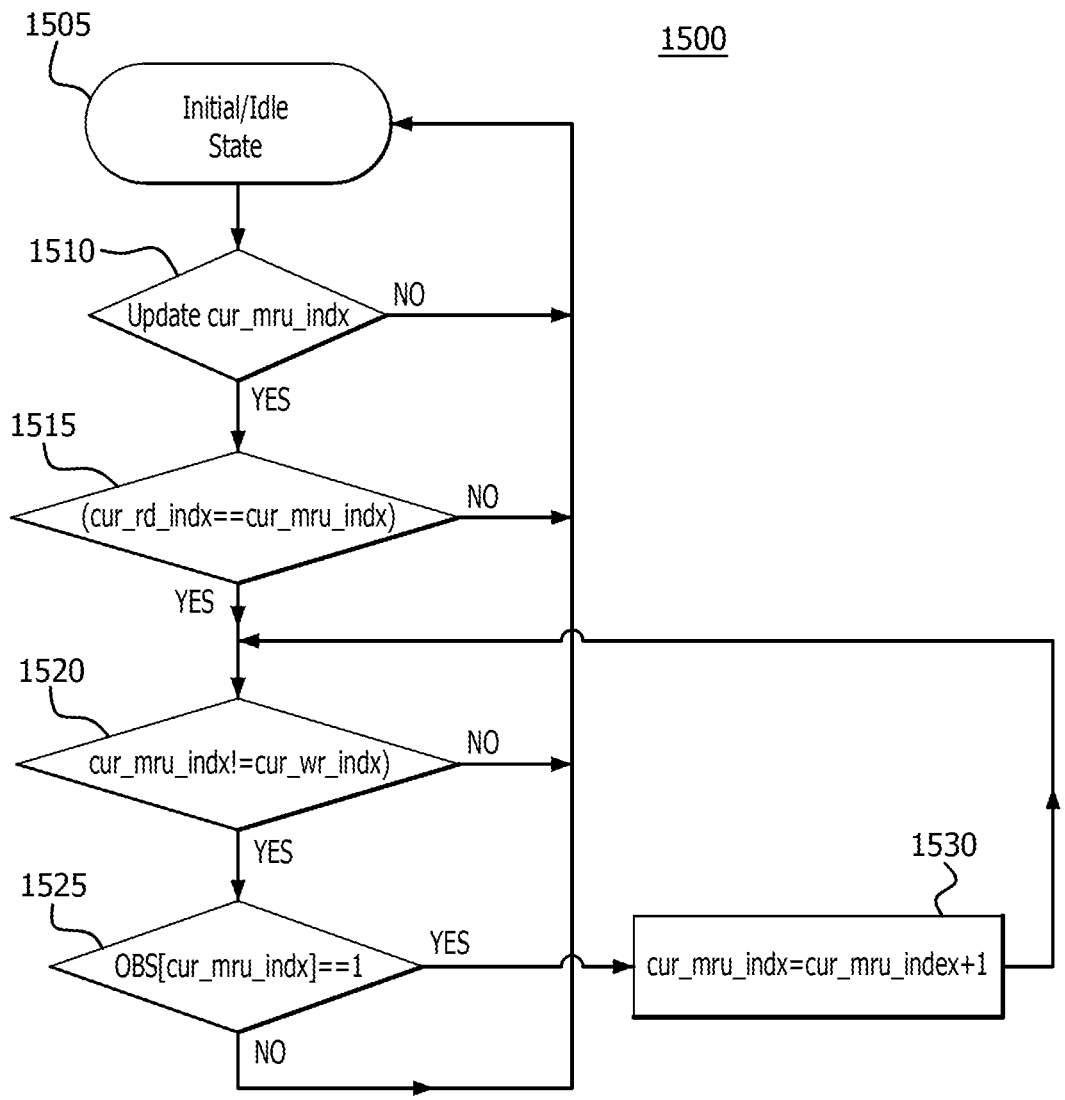
FIG. 15 illustrates the ring buffer most recent usable index calculation.

For each read data return to read client, a calculation of the most recent usable (MRU) index is performed to expose the free space of corresponding ring buffers. FIG. 15 illustrates the ring buffer 200 most recent usable index calculation 1500. Calculation 1500 begins at step 1505 with an initial or idle state to wait for a read request. At step 1510, a decision on whether to update cur_mru_indx is performed. If this determination is negative, calculation 1500 returns to step 1505. If the determination is positive, at step 1515 a determination is made as to whether cur_rd_indx=cur_mru_indx. If this determination is negative, calculation 1500 returns to step 1505. If the determination is positive, at step 1520 a determination is made as to whether cur_mru_indx=cur_wr_indx and cur_mru_indx is set equal to cur_mru_index+1 at step 1530. If the determination at step 1520 is negative, calculation 1500 returns to step 1505. If the determination at step 1520 is positive, at step 1525 a determination is made as to whether OBS [cur_mru_indx] equals 1. If the determination at step 1525 is negative, calculation 1500 returns to step 1505. If the determination at step 1525 is positive, at step 1530, cur_mru_indx is set equal to cur_mru_index+1.

Figure 16:
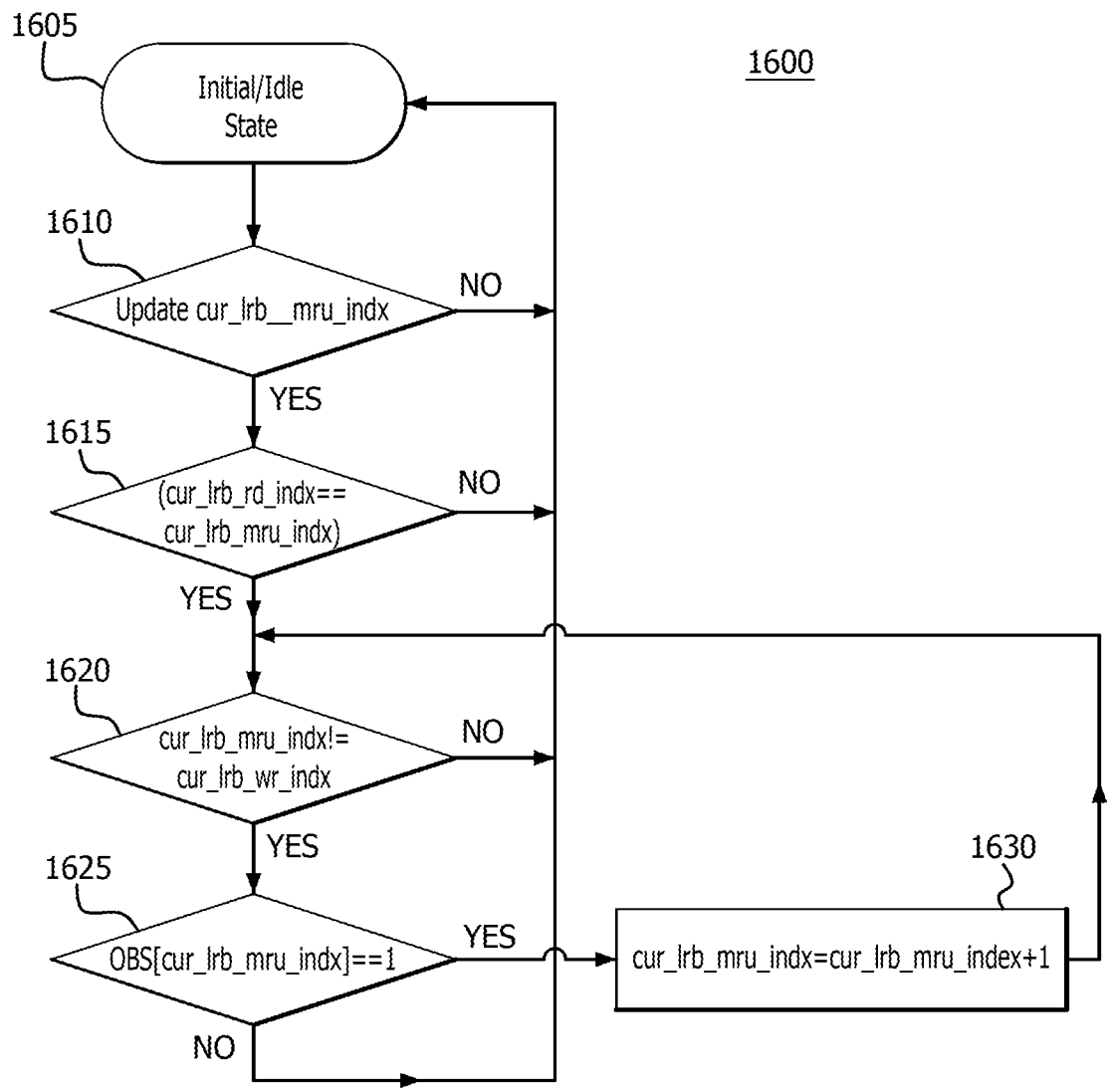
FIG. 16 illustrates the legacy ring buffer most recent usable index calculation.

FIG. 16 illustrates the legacy ring buffer 250 most recent usable index calculation 1600. Calculation 1600 begins at step 1605 with an initial or idle state to wait for a read request. At step 1610, a decision on whether to update cur_lrb_mru_indx is performed. If this determination is negative, calculation 1600 returns to step 1605. If the determination is positive, at step 1615 a determination is made as to whether cur_lrb_rd_indx=cur_lrb_mru_infix. If this determination is negative, calculation 1600 returns to step 1605. If the determination is positive, at step 1620 a determination is made as to whether cur_lrb_mru_indx=cur_lrb_wr_indx and cur_lrb_mru_indx is set equal to cur_lrb_mru_index+1 at step 1630. If the determination at step 1620 is negative, calculation 1600 returns to step 1605. If the determination at step 1620 is positive, at step 1625 a determination is made as to whether OBS[cur_lrb_mru_indx] equals 1. If the determination at step 1625 is negative, calculation 1600 returns to step 1605. If the determination at step 1625 is positive, at step 1560, cur_lrb_mru_indx is set equal to cur_lrb_mru_indx+1.

Cur_lrb_mru_indx is used to retrieve associated data block address in legacy ring buffer 250 with cur_lrb_mru_rd_addr=ADDR[cur_lrb_mru_indx] and combining cur_lrb_wr_addr applied to determine if legacy ring buffer 250 has free space to fill.

Figure 17:
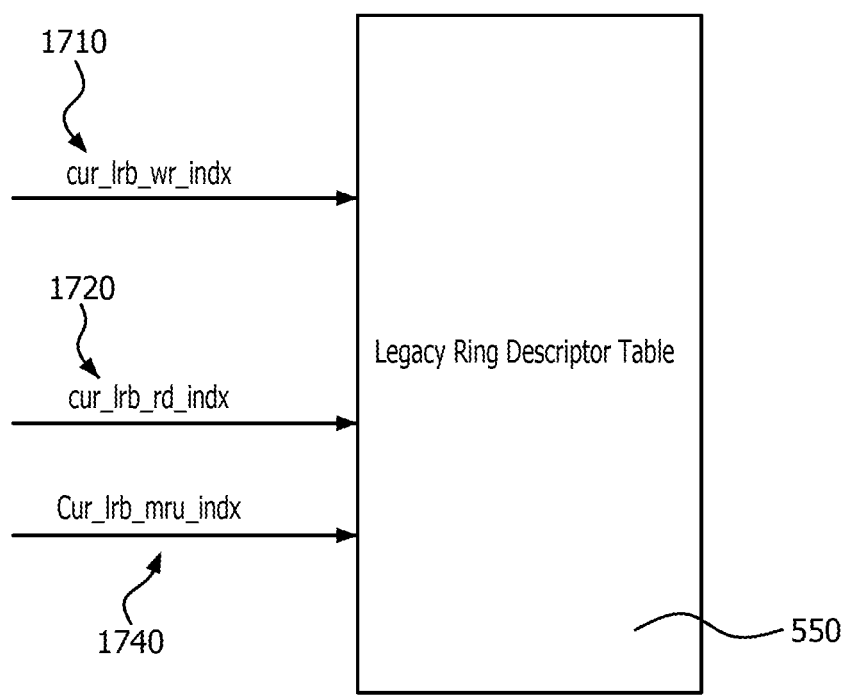
FIG. 17 illustrates an example where current read index is between current write index and most recent usable index leaving cur_lrb_mru_indx unchanged.

FIG. 17 illustrates an example 1700 where current read index 1720 is between current write index 1710 and most recent usable index 1740 leaving cur_lrb_mru_indx 1710 unchanged. In an implementation, example 1700 may operate as described in one of FIGS. 14-16.

Figure 18:
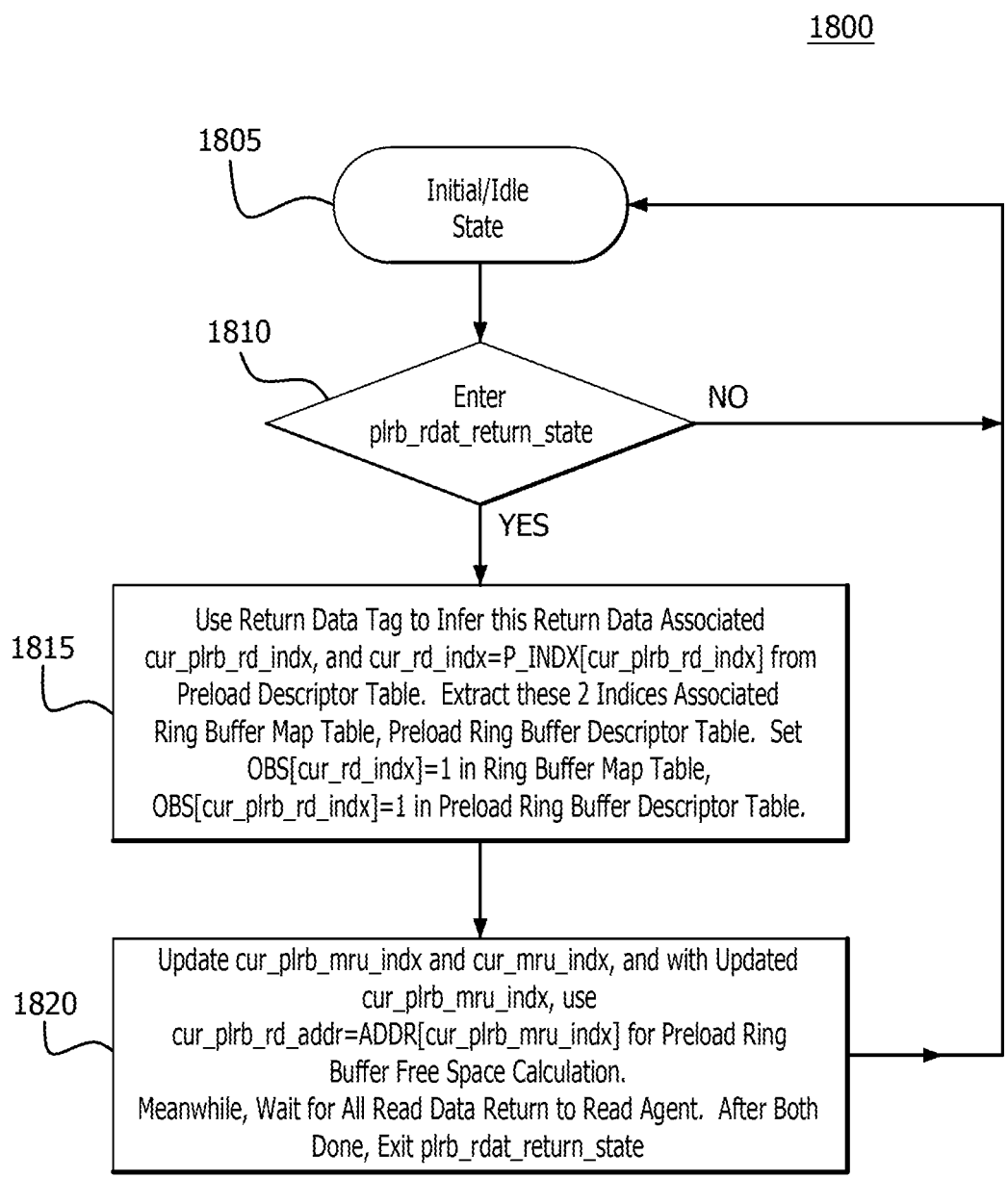
FIG. 18 illustrates the operations in state plrb_rdata_return_state of the FSM of FIG. 9.

FIG. 18 illustrates the operations in state plrb_rdat_return_state 960 of the FSM 900 of FIG. 9. Method 1800 begins at step 1805 with an initial or idle state to wait for a read data return from preload ring buffer 230. At step 1810, a decision about entering plrb_rdat_return_state 960 occurs. If the state is not entered, method 1800 loops back to step 1805. If plrb_rdat_return_state 960 is entered, then at step 1815 the return data tag is used to infer the return data associated cur_plrb_rd_indx and cur_rd_indx is set equal to P_INDX[cur_plrb_rd_indx] from the preload ring buffer descriptor table. At step 1815, OBS[cur_rd_indx] and OBS [cur_plrb_rd_indx] is extracted from the ring buffer map table and the preload ring buffer descriptor table, respectively. OBS[cur_rd_indx] is set equal to 1 in the ring buffer map table and OBS[cur_plrb_rd_indx] is set equal to 1 in the preload ring buffer descriptor table. At step 1820, cur_plrb_mru_indx and cur_mru_indx are updated with cur_plrb_mru_indx and cur_plrb_rd_addr=ADDR[cur_plrb_mru_indx] is used for preload ring buffer free space calculation. Once all of the read data is written to the read agent, plrb_rdat_return_state 960 is exited.

Figure 19:
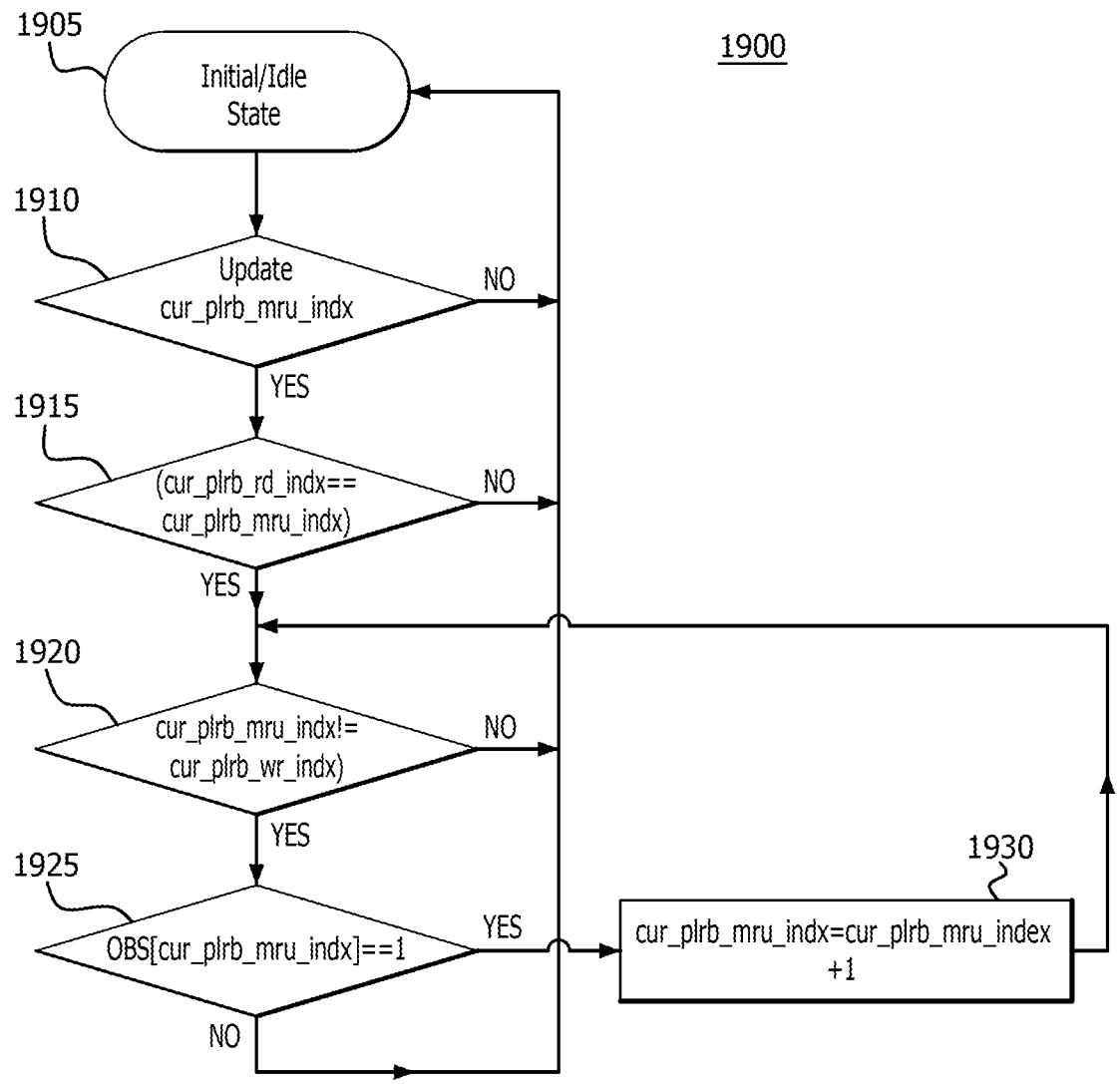
FIG. 19 illustrates the preload ring buffer most recent usable index calculation.

FIG. 19 illustrates the preload ring buffer 230 most recent usable index calculation 1900. Calculation 1900 begins at step with an initial or idle state to wait for a read request. At step 1910, a decision on whether to update cur_plrb_mru_indx is performed. If this determination is negative, calculation 1900 returns to step 1905. If the determination is positive, at step 1915 a determination is made as to whether cur_plrb_rd_indx=cur_plrb_mru_indx. If this determination is negative, calculation 1900 returns to step 1905. If the determination is positive, at step 1920 a determination is made as to whether cur_plrb_mru_indx=cur_plrb_wr_indx and cur_plrb_mru_indx is set equal to cur_plrb_mru_indx+1 at step 1930. If the determination at step 1920 is negative, calculation 1900 returns to step 1905. If the determination at step 1920 is positive, at step 1925 a determination is made as to whether OBS[cur_plrb_mru_indx] equals 1. If the determination at step 1925 is negative, calculation 1900 returns to step 1905. If the determination at step 1925 is positive, at step 1930, cur_plrb_mru_indx is set equal to cur_plrb_mru_indx+1.

Cur_plrb_mru_indx is used to retrieve associated data block address in preload ring buffer 230 with cur_plrb_mru_rd_addr=ADDR[cur_plrb_mru_indx] and combining cur_plrb_wr_addr applied to determine if preload ring buffer 230 has free space to fill.

Figure 20:
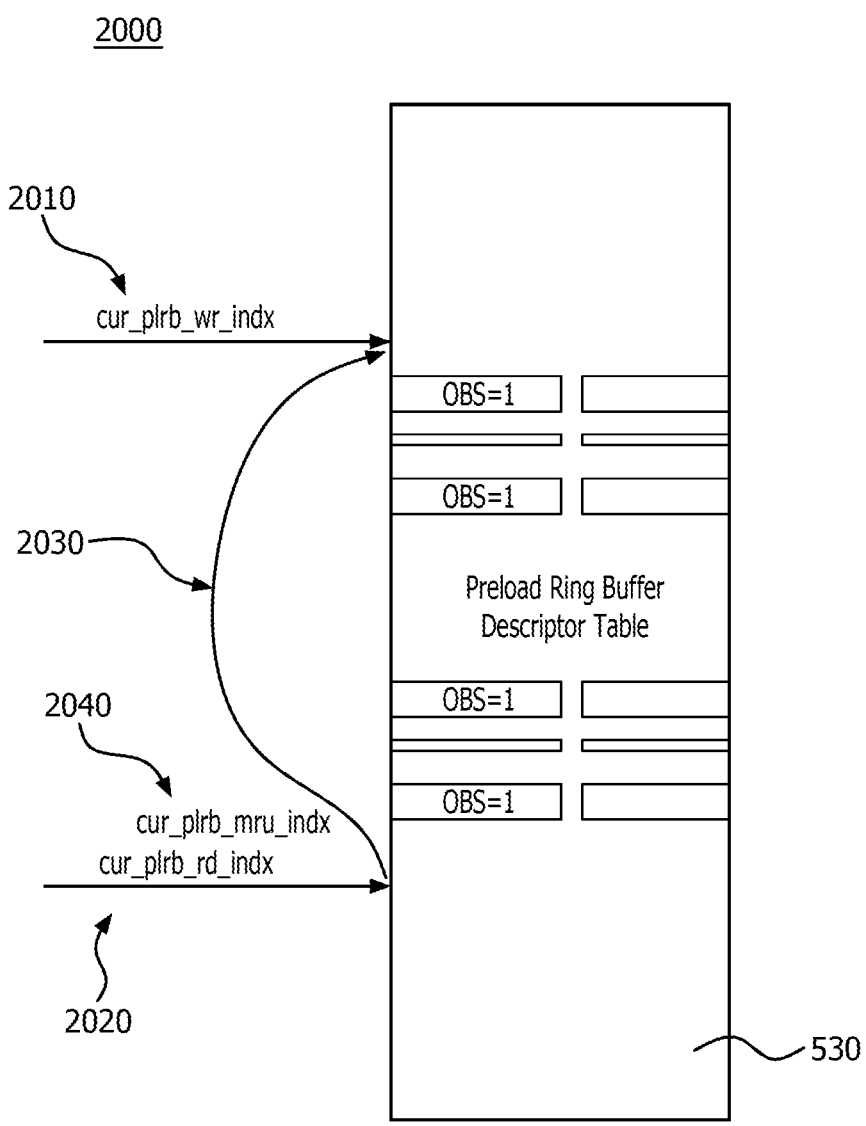
FIG. 20 illustrates an example where current read index equals the most recent usable index skipping all obsolete entries up to current write index.

FIG. 20 illustrates an example 2000 where current read index 2020 equals the most recent usable index 2040 skipping all obsolete entries 2030 up to current write index 2010. In an implementation, example 2000 may operate as described in one of FIGS. 18-19.

Figure 21:
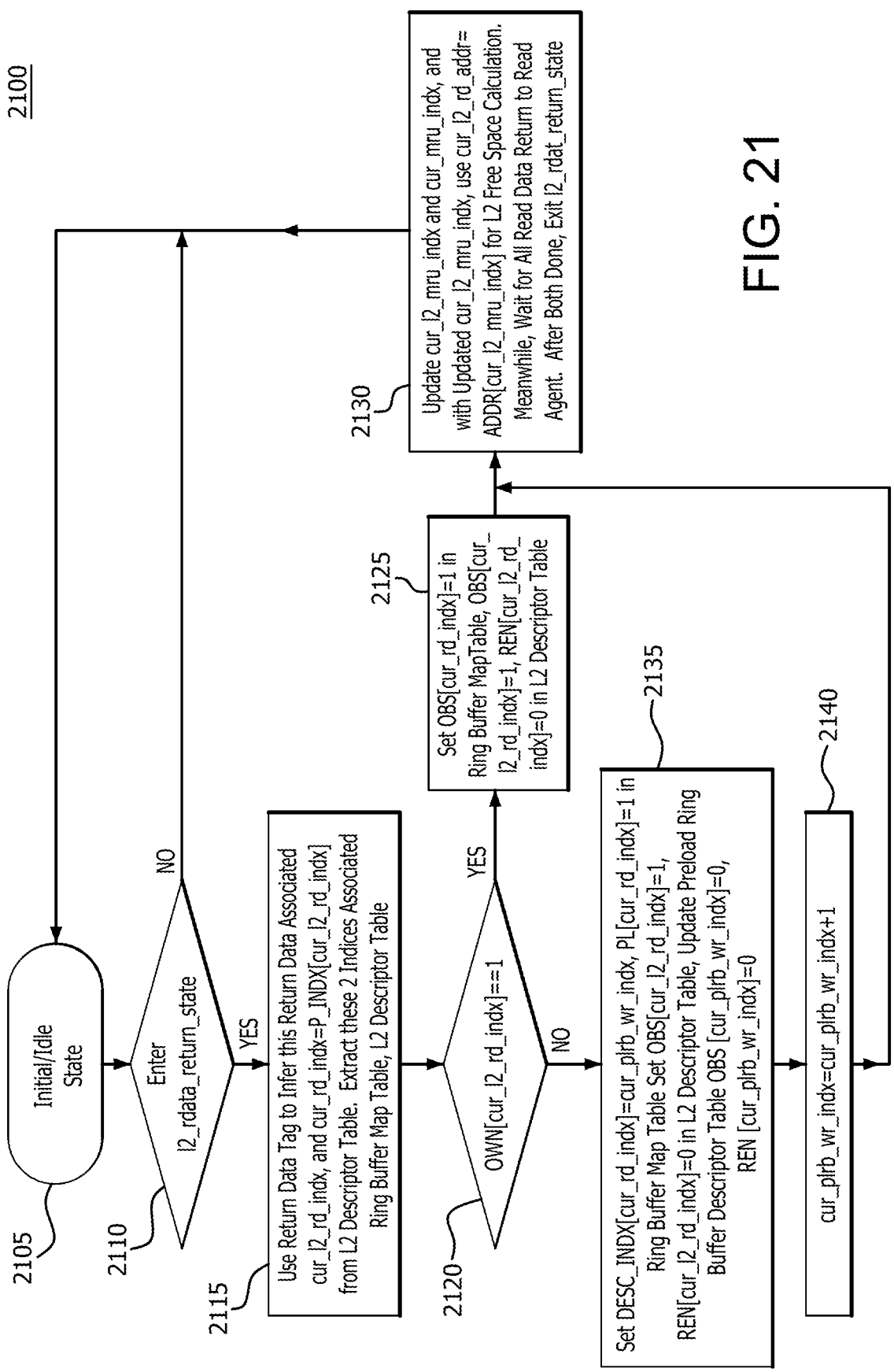
FIG. 21 illustrates the operations in state l2_rdata_return_state of the FSM of FIG. 9.

FIG. 21 illustrates the operations in state l2_rdat_return_state 940 of the FSM 900 of FIG. 9. Method 2100 begins at step 2105 with an initial or idle state to wait for a read data return from L2 260. At step 2110, a decision about entering l2_rdat_return_state 940 occurs. If the state is not entered, method 2100 loops back to step 2105. If l2_rdat_return_state 940 is entered, then at step 2115 the return data tag is used to infer the return data associated cur_l2_rd_indx and cur_rd_indx is set equal to P_INDX [cur_l2_rd_indx] from the L2 descriptor table. At step 2120, a determination is made as to whether OWN

[cur_l2_rd_indx]=1. If the determination at step 2120 is positive, at step 2125, OBS[cur_rd_indx] and OBS [cur_l2_rd_indx] is extracted from the ring buffer map table and the L2 descriptor table, respectively. OBS[cur_rd_indx] is set equal to 1 in the ring buffer map table and OBS [cur_l2_rd_indx] is set equal to 1 in the L2 descriptor table. At step 2130, cur_l2_mru_indx and cur_mru_indx are updated with cur_l2_mru_indx and cur_l2_rd_addr=ADDR [cur_l2_mru_indx] is used for L2 free space calculation. Once all of the read data is written to the read agent, l2_rdat_return_state 940 is exited.

If step 2120 is negative, step 2135 and step 2140 is performed prior to performing step 2130. Step 2135 sets DESC_INDX[cur_rd_indx]=cur_plrb_wr_indx and PL[cur_rd_indx]=1 in the ring buffer map table and sets OBS[cur_l2_rd_indx]=1 and REN[cur_l2_rd_indx]=0 in the L2 descriptor table. Preload ring buffer 230 is updated as described in FIG. 6A steps 650, 655 and FIG. 6E. Step 2140 sets cur_plrb_wr_indx=cur_plrb_wr_indx+1.

Figure 22:
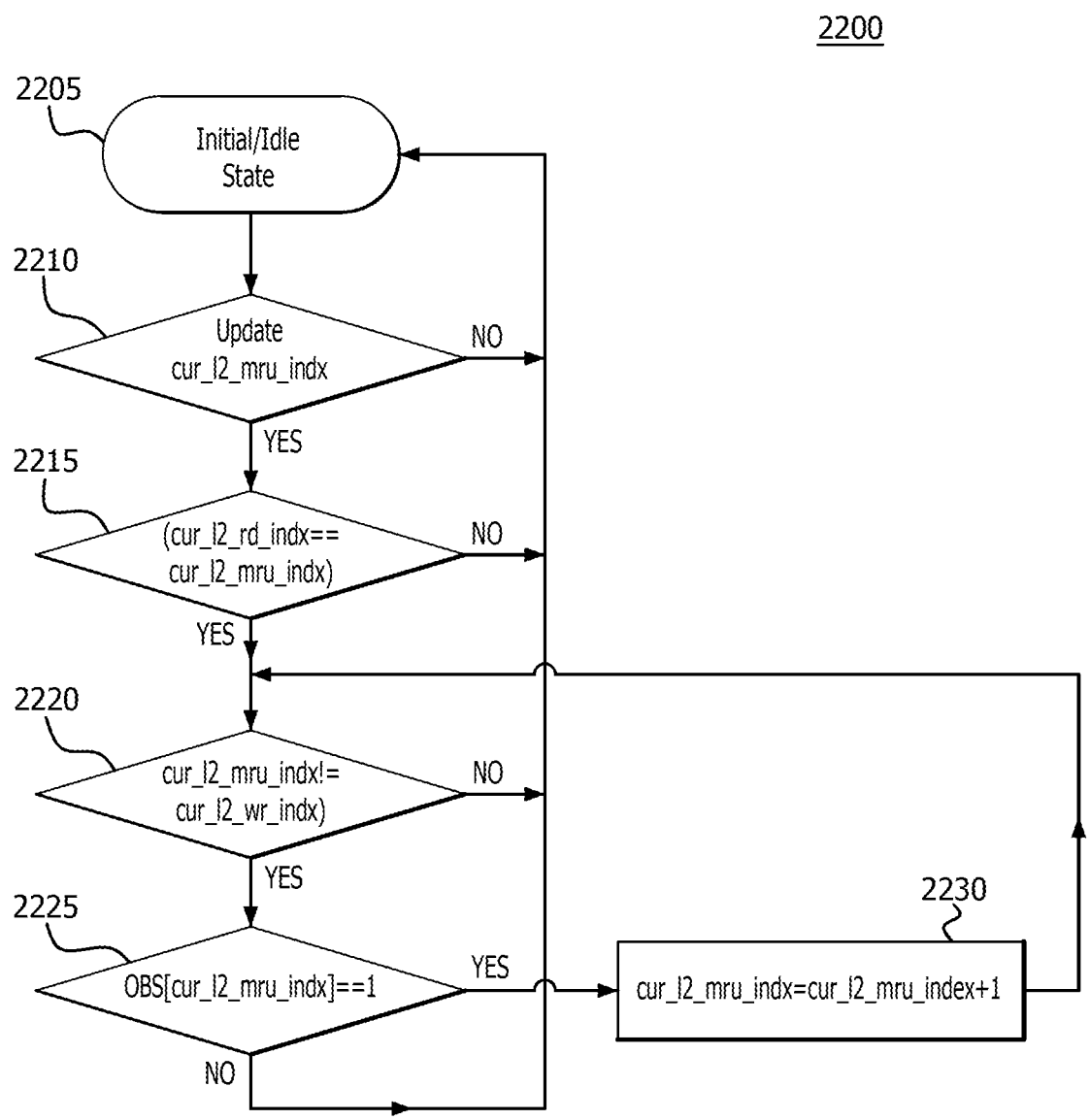
FIG. 22 illustrates the L2 most recent usable index calculation.

FIG. 22 illustrates the L2 260 most recent usable index calculation 2200. Calculation 2200 begins at step 2205 with an initial or idle state to wait for a read request. At step 2210, a decision on whether to update cur_l2_mru_indx is performed. If this determination is negative, calculation 2200 returns to step 2205. If the determination is positive, at step 2215 a determination is made as to whether cur_l2_rd_indx=cur_l2_mru_indx. If this determination is negative, calculation 2200 returns to step 2205. If the determination is positive, at step 2220 a determination is made as to whether cur_l2_mru_indx=cur_l2_wr_indx and cur_l2_mru_indx is set equal to cur_l2_mru_indx+1 at step 2230. If the determination at step 2220 is negative, calculation 2200 returns to step 2205. If the determination at step 2220 is positive, at step 2225 a determination is made as to whether OBS[cur_l2_mru_indx] equals 1. If the determination at step 2225 is negative, calculation 2200 returns to step 2205. If the determination at step 2225 is positive, at step 2230, cur_l2_mru_indx is set equal to cur_l2_mru_indx+1.

Cur_l2_mru_indx is used to retrieve associated data block address in L2 260 with cur_l2_mru_rd_addr=ADDR [cur_l2_mru_indx] and combining cur_l2_wr_addr applied to determine if L2 260 has free space to fill.

Figure 23:
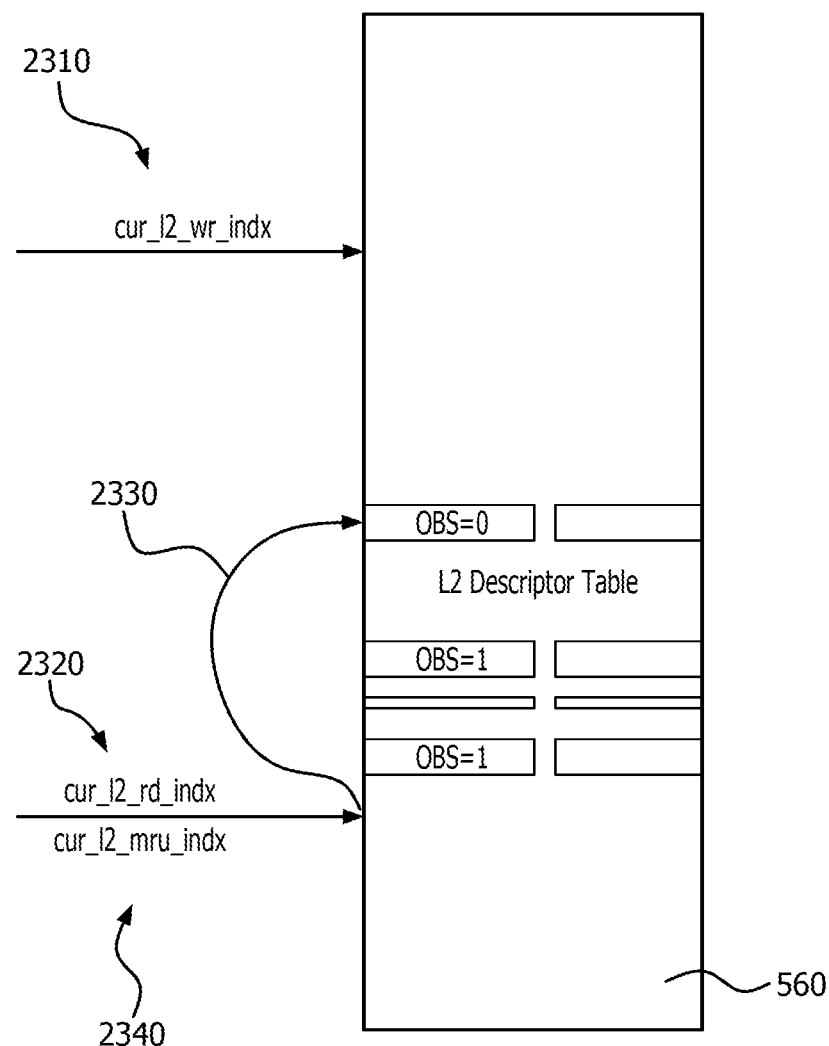
FIG. 23 illustrates an example where current read index equals the most recent usable index skipping all obsolete entries up to some usable entry.

FIG. 23 illustrates an example 2300 where current read index 2320 equals the most recent usable index 2340 skipping all obsolete entries 2330 up to some usable entry. In an implementation, example 2300 may operate as described in one of FIGS. 21-22.

The present invention supports random read (de-allocation) of data and outstanding read (de-allocation) from read client. The present invention operates with write data that is sequential so that the write data can be written to ring buffer in incoming order. The present invention operates with a read client using the write order index to retrieve data from ring buffer. Further, the order to read/write internal on-chip buffer ring or external L2/off-chip memory is maintained and the read return order as well. The read can be associated with de-allocation, or alternatively, "de-allocate" operations may be substituted for "read" operations. A "read but not de-allocate" operation may also be utilized where the read operation is performed, but the associated data block is not de-allocated. The above description utilizes descriptor tables of sufficient size to describe corresponding ring buffers.

It should be understood that many variations are possible based on the disclosure herein. Although features and elements are described above in particular combinations, each feature or element may be used alone without the other features and elements or in various combinations with or without other features and elements.

The methods provided may be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors may be manufactured by configuring a manufacturing process using the results of processed hardware description language (HDL) instructions and other intermediary data including netlists (such instructions capable of being stored on a computer readable media). The results of such processing may be maskworks that are then used in a semiconductor manufacturing process to manufacture a processor which implements aspects of the embodiments.

The methods or flow charts provided herein may be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A system for managing data in a ring buffer, said system comprising:
    a legacy ring buffer functioning as an on-chip ring buffer, the legacy ring buffer including a legacy ring buffer descriptor table;
    a large-sized buffer for storing data in the ring buffer, the large-sized buffer including a large-sized buffer descriptor table;
    a preload ring buffer that is on-chip and capable of receiving preload data from the large-sized buffer, the preload ring buffer including a preload ring buffer descriptor table;
    a ring buffer map table which maintains at least one index for each of the legacy ring buffer, the large-sized buffer, and the preload ring buffer;
    wherein writing to one of the legacy ring buffer, the large-sized buffer, and the preload ring buffer based on an assessment of available storage on the legacy ring buffer, the preload ring buffer and the large-sized buffer is associated with an update to the respective legacy ring buffer descriptor table, the large-sized buffer descriptor table, and the preload ring buffer descriptor table, in addition to the ring buffer map table.

2. The system of claim 1 wherein if the legacy ring buffer is not full and the large-sized buffer is empty, a write controller writes to the legacy ring buffer on a write request.

3. The system of claim 2 wherein the writing to the legacy ring buffer occurs on subsequent write requests until the legacy ring buffer is full.

4. The system of claim 1 wherein if the legacy ring buffer is full and the large-sized buffer is not full, a write controller stores data to the large-sized buffer on a write request.

5. The system of claim 1 wherein if the legacy ring buffer is full and there is no data in the large-sized buffer, a write controller writes data to preload ring buffer on a write request.

6. The system of claim 1 wherein upon receipt of the read request, a read controller examines the legacy ring buffer descriptor table and preload ring buffer descriptor table to satisfy the read request.

7. The system of claim 6 wherein if the legacy ring buffer contains the data to be read in the read request, the data is supplied from the legacy ring buffer to satisfy the read request.

8. The system of claim 6 wherein if the preload ring buffer contains the data to be read in the read request, the data is supplied from the preload ring buffer to satisfy the read request.

9. The system of claim 6 wherein if the legacy ring buffer and preload ring buffer do not contain the data to be read in the read request, the data read request is sent to the large-sized buffer to fetch the data.

10. The system of claim 9 wherein the read data is returned to the read client from the large-sized buffer.

11. The system of claim 1 wherein the read controller determines that preload ring buffer is not full and there is data stored in the large-sized buffer, the read controller loads an oldest usable data from the large-sized buffer to the preload ring buffer.

12. The system of claim 1 wherein the large-sized buffer is an off-chip memory.

13. The system of claim 12 wherein the off-chip memory is a DDR.

14. The system of claim 1 wherein the large-sized buffer is an L2 cache.

15. A method for writing data in a ring buffer, the ring buffer including a legacy ring buffer functioning as an on-chip buffer, a large-sized buffer for storing data from the ring buffer and a preload ring buffer that is on-chip and capable of receiving preload data from the large-sized buffer, the method comprising:

receiving a write request from a write client to write data; and writing the data to the legacy ring buffer on the write request, if the legacy ring buffer is not full and the large-sized buffer is empty and updating the legacy ring buffer descriptor table with the ring buffer map table, writing the data to preload ring buffer on the write request, if the legacy ring buffer is full, the preload ring buffer is not full and there is no data in the large-sized buffer updating the preload ring buffer descriptor table with the ring buffer map table, and writing the data to the large-sized buffer on the write request, if the legacy ring buffer and preload ring buffer are full and the large-sized buffer is not full and updating the large-sized buffer descriptor table with the ring buffer map table.

16. The method of claim 15 wherein the writing to the legacy ring buffer occurs on subsequent write requests until the legacy ring buffer is full.

17. The method of claim 15 wherein the large-sized buffer is an L2 cache.

18. A method for reading data in a ring buffer, the ring buffer including a legacy ring buffer functioning as an on-chip buffer, a large-sized buffer for storing data from the ring buffer and a preload ring buffer that is on-chip and capable of receiving preload data from the large-sized buffer, the method comprising:

preloading data from the large-sized buffer to the preload ring buffer based on a predetermined preload condition; and updating a large-sized buffer descriptor table, a preload ring buffer descriptor table and a ring buffer map table;

examining the ring buffer map table to satisfy a read request for the data; and if the legacy ring buffer contains the data to be read in the read request, supplying the data from the legacy ring buffer to satisfy the read request, if the preload ring buffer contains the data to be read in the read request, supplying the data from the preload ring buffer to satisfy the read request, and if the legacy ring buffer and preload ring buffer do not contain the data to be read in the read request, sending the data read request to the large-sized buffer to fetch the data, wherein the read data is returned to the read client from the large-sized buffer.

19. The method of claim 18, wherein further comprising loading the oldest usable data from the large-sized buffer to the preload ring buffer, after determining that the preload ring buffer is not full and there is data stored in the large-sized buffer.

20. The method of claim 19 wherein the large-sized buffer is an off-chip memory.

* * * * *